(12) United States Patent
Park et al.

(10) Patent No.: US 11,211,578 B2
(45) Date of Patent: Dec. 28, 2021

(54) DISPLAY DEVICE

(71) Applicant: LG Display Co., Ltd., Seoul (KR)

(72) Inventors: TaeHan Park, Paju-si (KR); Jiho Ryu, Paju-si (KR); Dongyoung Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 176 days.

(21) Appl. No.: 16/726,486

(22) Filed: Dec. 24, 2019

(65) Prior Publication Data

US 2020/0212347 A1 Jul. 2, 2020

(30) Foreign Application Priority Data

Dec. 27, 2018 (KR) .................. 10-2018-0170907

(51) Int. Cl.
*H01L 51/52* (2006.01)
*H01L 27/32* (2006.01)

(52) U.S. Cl.
CPC ........ *H01L 51/5218* (2013.01); *H01L 27/322* (2013.01); *H01L 27/3213* (2013.01); *H01L 51/5271* (2013.01); *H01L 51/5284* (2013.01)

(58) Field of Classification Search
CPC ..................................................... H01L 51/52
See application file for complete search history.

(56) References Cited

U.S. PATENT DOCUMENTS

| 2010/0148192 A1 | 6/2010 | Jung et al. |
| 2015/0188095 A1 | 7/2015 | Yoo et al. |

FOREIGN PATENT DOCUMENTS

| JP | 11-265794 A | 9/1999 |
| KR | 10-2010-0067463 A | 6/2010 |

OTHER PUBLICATIONS

Extended European Search Report issued in European Patent Application No. 19214738.7 dated Jun. 12, 2020.

*Primary Examiner* — Marvin Payen
(74) *Attorney, Agent, or Firm* — Morgan, Lewis & Bockius LLP

(57) ABSTRACT

A display device includes a substrate with a first subpixel and a second subpixel; a first electrode on the substrate, including a first sub electrode provided on the first subpixel and a second sub electrode on the second subpixel; an organic light emitting layer on the first electrode; a second electrode on the organic light emitting layer; a first bank between the first sub electrode and the second sub electrode to partition the first subpixel and the second subpixel from each other; and a light absorption portion inside each of the first sub electrode and the second sub electrode to absorb external light. The first sub electrode includes a reflective metal to cover the light absorption portion. The reflective metal and the second electrode emit light emitted from the organic light emitting layer to the substrate by reflecting the light emitted from the organic light emitting layer.

20 Claims, 13 Drawing Sheets

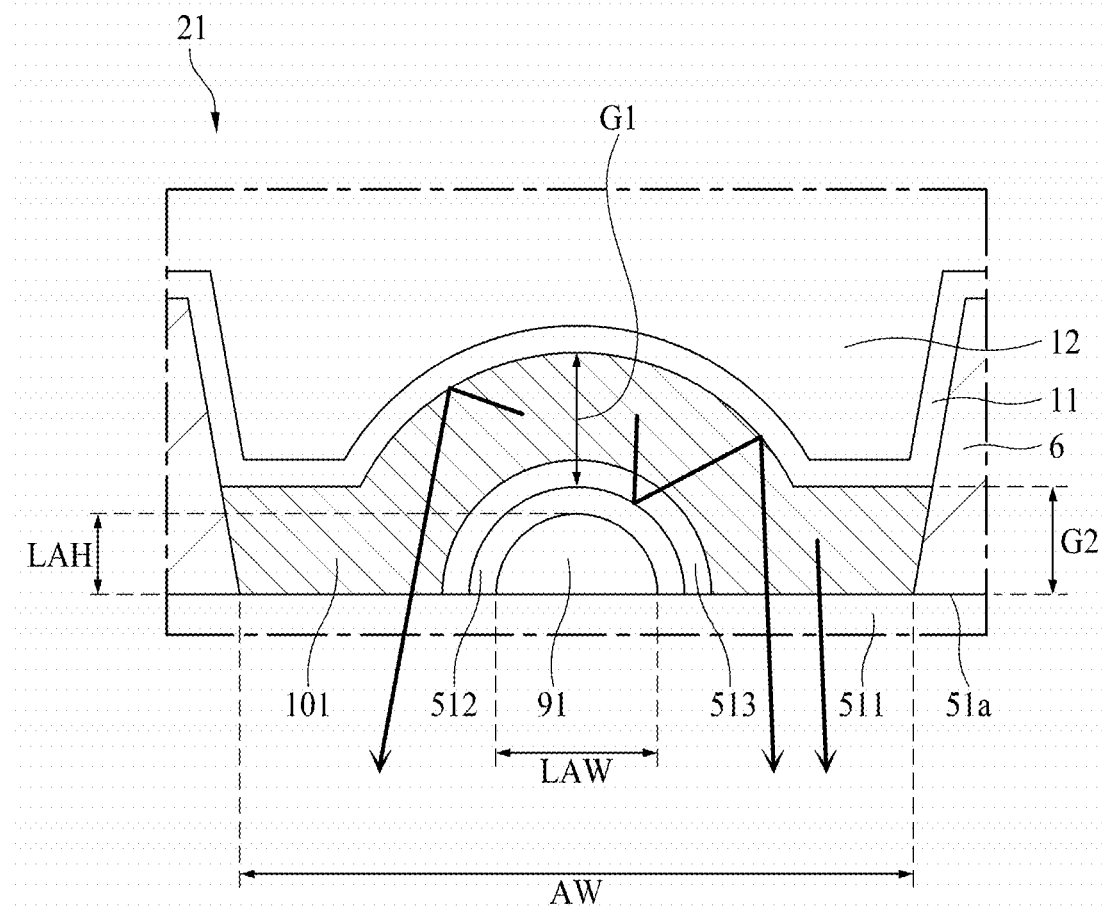

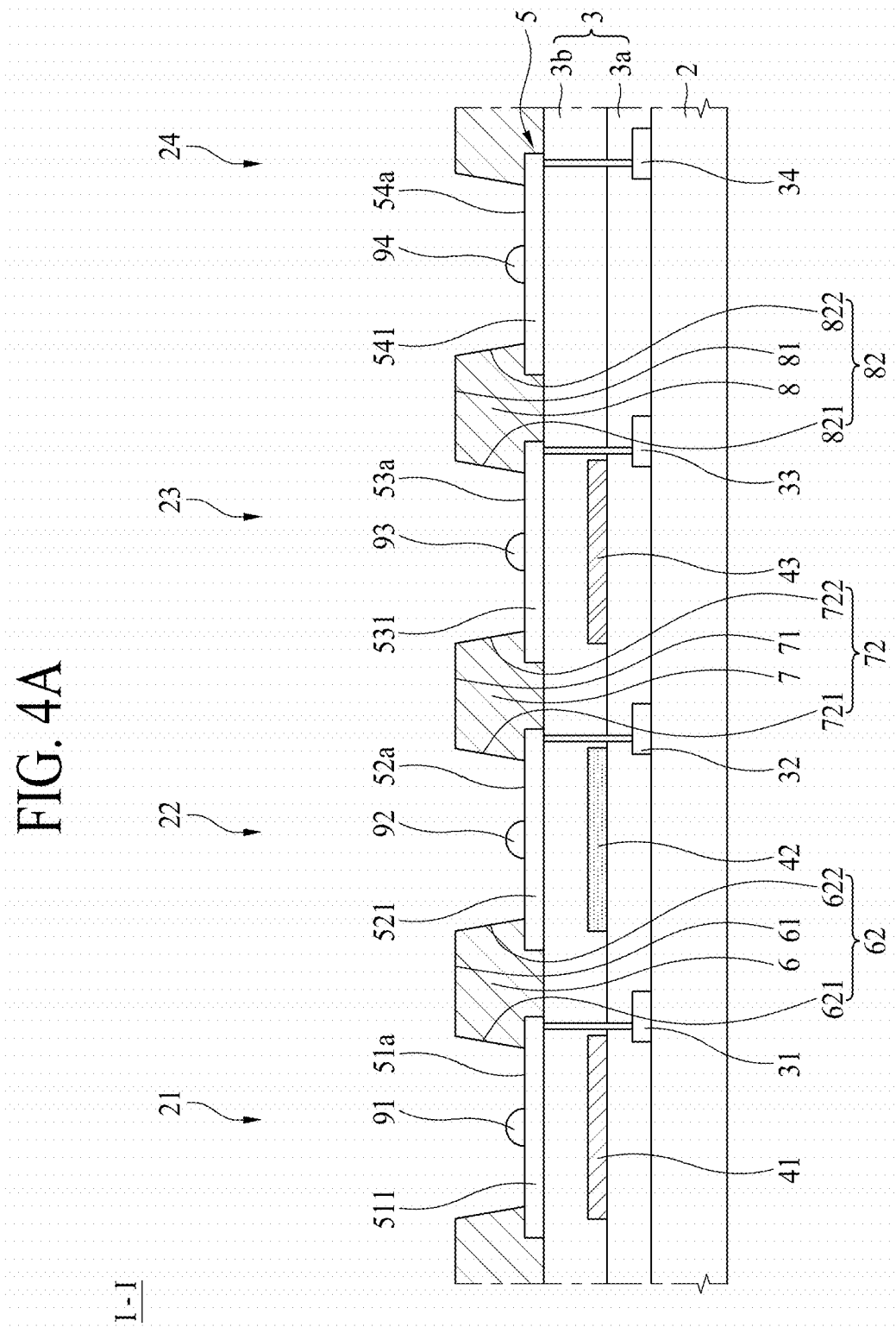

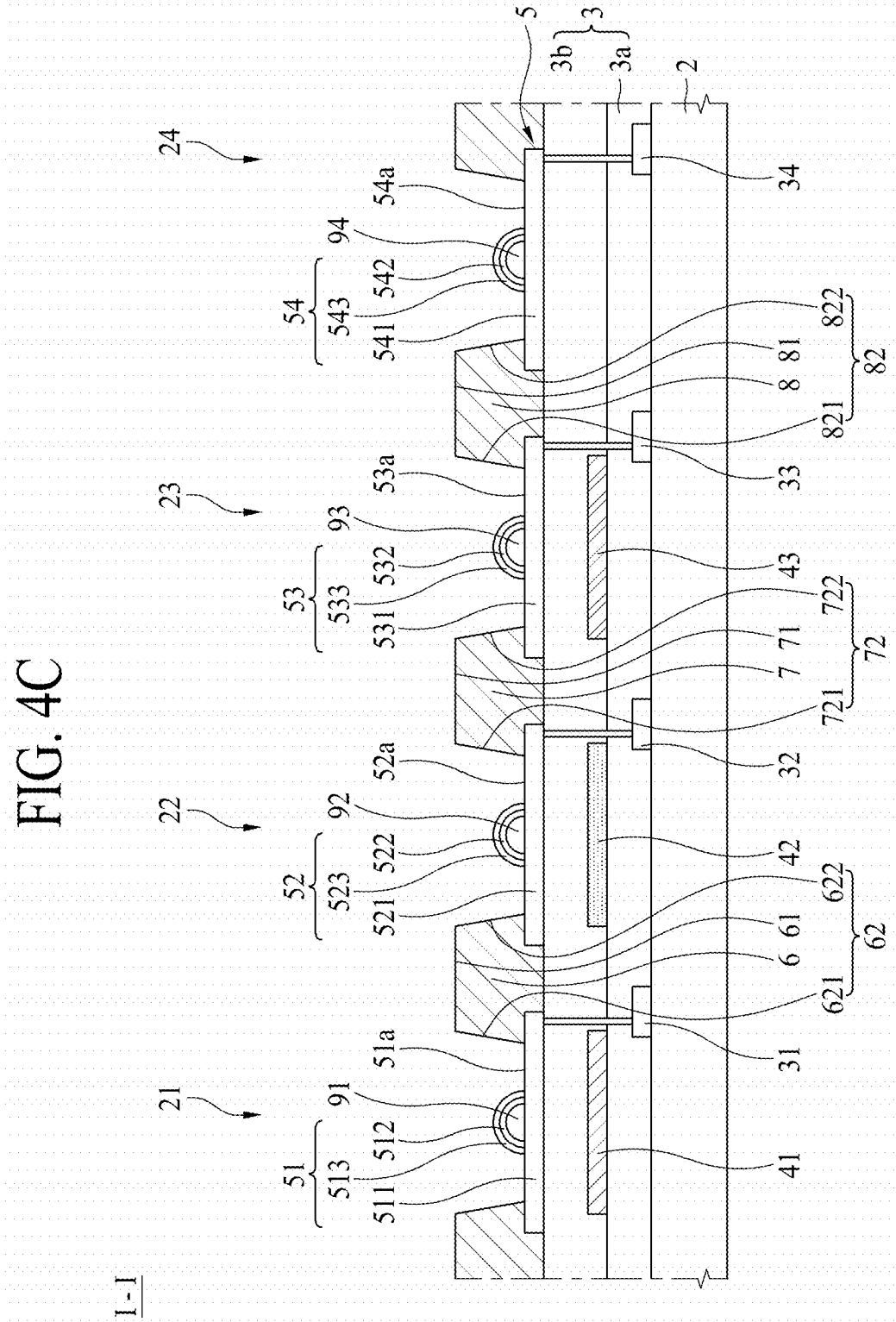

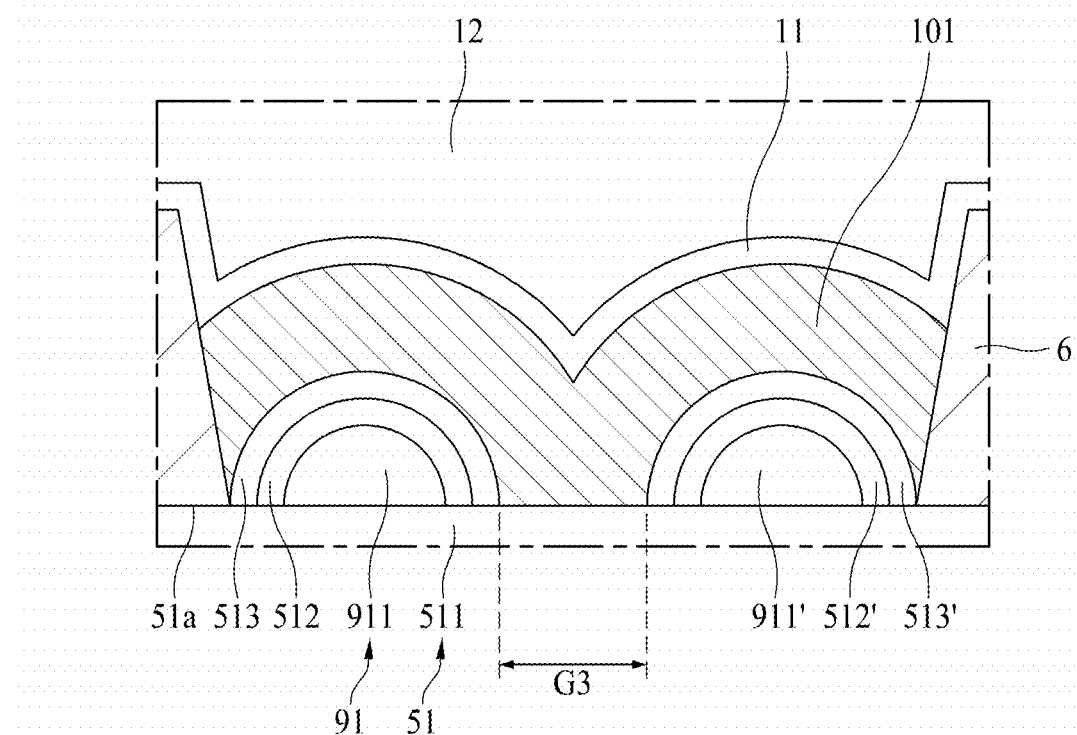

DISPLAY DEVICE

The present application claims the priority of Korean Patent Application No. 10-2018-0170907, filed Dec. 27, 2018, which is hereby incorporated by reference.

BACKGROUND

Technical Field

The present disclosure relates to a display device displaying an image.

Description of the Related Art

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

An organic light emitting display device has a structure that a light emitting layer is formed between an anode electrode and a cathode electrode, and is a device for displaying an image by allowing a light emitting layer to emit light by an electric field between the two electrodes.

Meanwhile, a polarizer POL for preventing external light which is reflected from entering a user's eyes is arranged above or below the light emitting layer. The polarizer is arranged above the light emitting layer in case of a top emission method, and is arranged below the light emitting layer in case of a bottom emission method. If the polarizer POL is arranged above or below the light emitting layer, light emitted from the light emitting layer is partially shielded by the polarizer POL, whereby a problem occurs in that light emission efficiency is deteriorated. This problem occurs more seriously in case of a display device, which requires ultra-high resolution, such as a head mounted display.

SUMMARY

Accordingly, embodiments of the present disclosure are directed to a display device that substantially obviates one or more of the problems due to limitations and disadvantages of the related art.

The present disclosure has been made in view of the above problems, and an aspect of the present disclosure is to provide a display device that can improve light emitting efficiency, as compared with a case that a polarizer is provided, while reducing external light reflectivity.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate provided with a first subpixel and a second subpixel, a first electrode provided on the substrate, including a first sub electrode provided on the first subpixel and a second sub electrode provided on the second subpixel, an organic light emitting layer arranged on the first electrode, a second electrode arranged on the organic light emitting layer, a first bank provided between the first sub electrode and the second sub electrode to partition the first subpixel and the second subpixel from each other, and a light absorption portion arranged inside each of the first sub electrode and the second sub electrode to absorb external light, wherein the first sub electrode includes a reflective metal provided to cover the light absorption portion, and the reflective metal and the second electrode emit light emitted from the organic light emitting layer to the substrate by reflecting the light emitted from the organic light emitting layer.

In the display device according to the present disclosure, the light absorption portion may be arranged in the first electrode to lower external light reflectivity, and light emitted from the organic light emitting layer may be reflected and re-reflected through the reflective metal and the second metal, which are arranged at both sides of the organic light emitting layer, whereby light emitting efficiency may be more improved than the case that a polarizer is provided on the organic light emitting layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 3 is a brief enlarged view illustrating a light absorption portion of a first subpixel shown in FIG. 2;

FIGS. 4A to 4E are cross-sectional views illustrating a brief manufacturing process of a display device according to one embodiment of the present disclosure;

FIG. 5 is a brief cross-sectional view taken along line II-II shown in FIG. 1;

DETAILED DESCRIPTION

Figure 1:
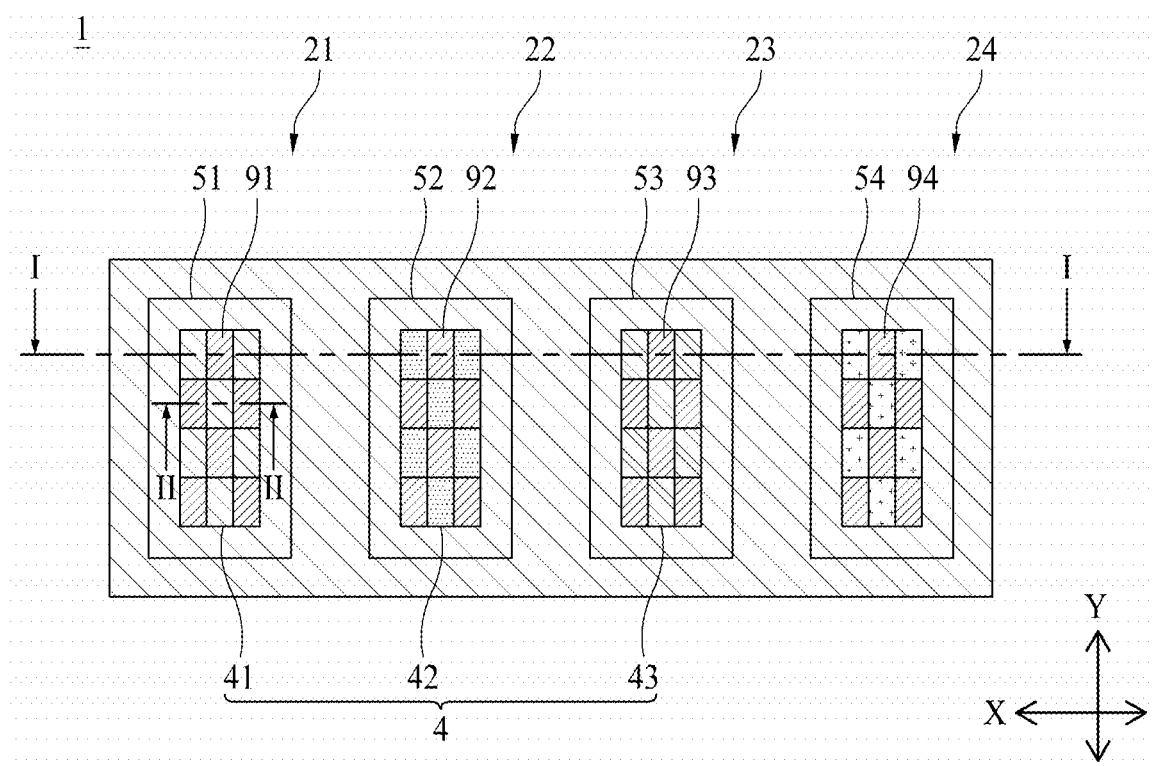
FIG. 1 is a brief plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship between two portions is described as 'upon~', 'above~', 'below~', and 'next to~', one or more other portions may be arranged between the two portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 2:
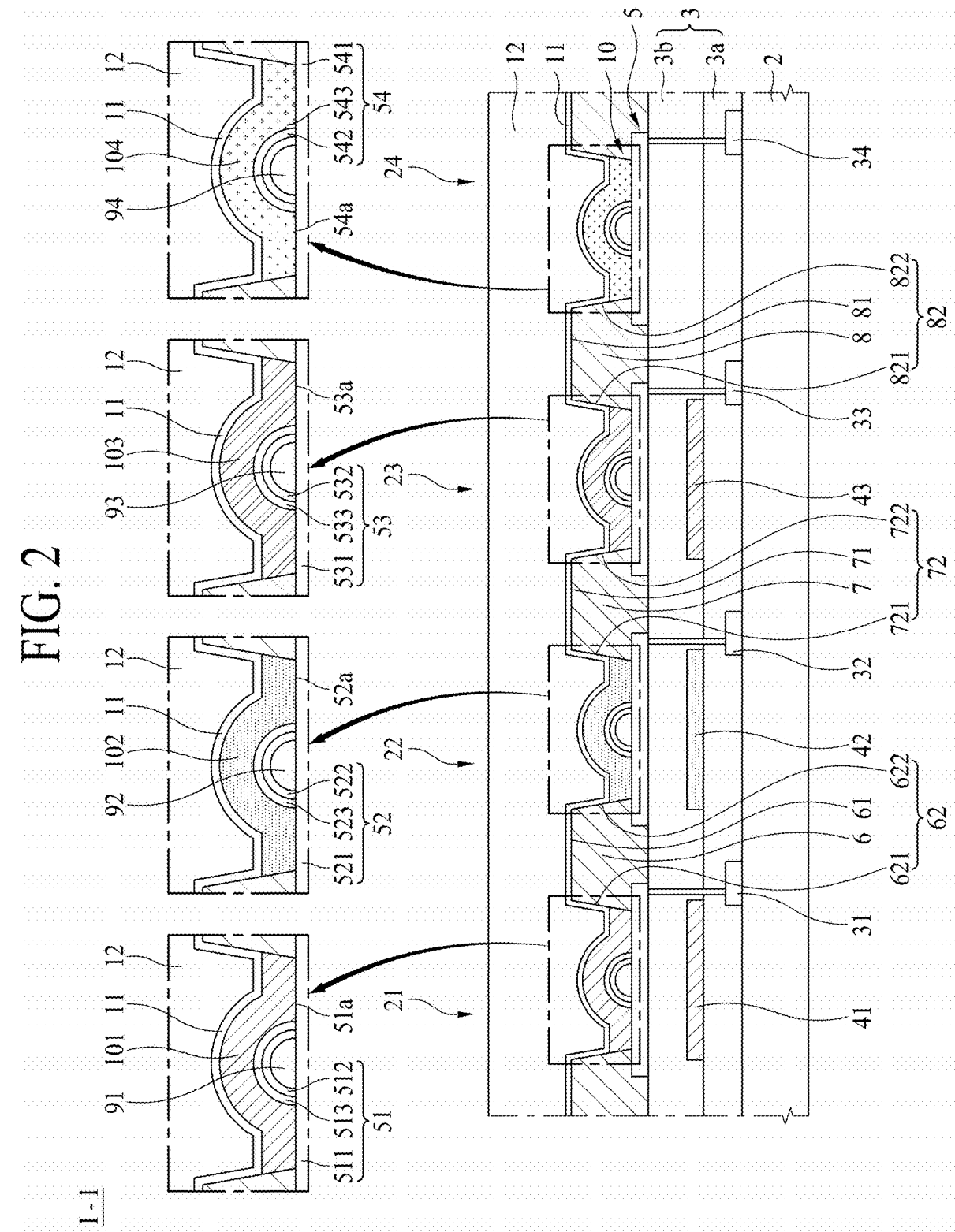
FIG. 2 is a brief cross-sectional view taken along line I-I shown in FIG. 1.

FIG. 1 is a brief plane view illustrating a display device according to one embodiment of the present disclosure, FIG. 2 is a brief cross-sectional view taken along line I-I shown in FIG. 1, and FIG. 3 is a brief enlarged view illustrating a light absorption portion of a first subpixel shown in FIG. 2.

Referring to FIGS. 1 to 3, the display device 1 according to one embodiment of the present disclosure comprises a substrate 2, a circuit element layer 3, a color filter layer 4, a first electrode 5, a first bank 6, a second bank 7, a third bank 8, a light absorption portion 9, an organic light emitting layer 10, a second electrode 11, and an encapsulation layer 12.

The substrate 2 may be a semiconductor substrate such as a plastic film, a glass substrate, or silicon. The substrate 2 may be made of a transparent material or an opaque material. The display device 1 according to one embodiment of the present disclosure is provided in a bottom emission method and therefore a transparent material may be used as a material of the substrate 2.

A first subpixel 21, a second subpixel 22, a third subpixel 23, and a fourth subpixel 24 are provided on the substrate 2. The second subpixel 22 according to one example may be arranged to be adjacent to one side of the first subpixel 21. The third subpixel 23 according to one example may be arranged to be adjacent to one side of the second subpixel 22. The fourth subpixel 24 according to one example may be arranged to be adjacent to one side of the third subpixel 23. Therefore, the first subpixel 21, the second subpixel 22, the third subpixel 23 and the fourth subpixel 24 may sequentially be arranged on the substrate 2.

The first subpixel 21 may be provided to emit red (R) light, the second subpixel 22 may be provided to emit green (G) light, the third subpixel 23 may be provided to emit blue (B) light, and the fourth subpixel 24 may be provided to emit white (W) light, but these subpixels are not limited to this case. Also, an arrangement sequence of the subpixels 21, 22, 23 and 24 may be changed in various ways.

Each of the first subpixel 21, the second subpixel 22, the third subpixel 23, and the fourth subpixel 24 may be provided to include the first electrode 5, the light absorption portion 9, the organic light emitting layer 10, the second electrode 11, and the encapsulation layer 12. Also, each of the first subpixel 21, the second subpixel 22 and the third subpixel 23 may be provided to further include the color filter layer 4. However, if the fourth subpixel 24 is provided to emit white light, the fourth subpixel 24 may not include the color filter layer 4. This is because that the organic light emitting layer 10 provided on the fourth subpixel 24 emits white light.

The display device 1 according to one embodiment of the present disclosure is provided in a bottom emission method in which emitted light is emitted to a bottom portion, and therefore a transparent material may be used as a material of the substrate 2.

The circuit element layer 3 is arranged on one surface of the substrate 2.

A circuit element comprising a plurality of thin film transistors 31, 32, 33 and 34, various types of signal lines, and a capacitor is provided in the circuit element layer 3 for each of the subpixels 21, 22, 23 and 24. The signal lines may include gate lines, data lines, power lines and reference lines, and the thin film transistors 31, 32, 33 and 34 may include a switching thin film transistor, a driving thin film transistor, and a sensing thin film transistor. The subpixels 21, 22, 23 and 24 may be defined by a crossing structure of gate lines, reference voltage lines, power supply lines, and data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 5.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first transistor 31, a second transistor 32, a third transistor 33 and a fourth transistor 34 are arranged in the circuit element layer 3 separately for each of the subpixels 21, 22, 23 and 24. The first transistor 31 according to one example may be connected to a first sub electrode 51 arranged on the first subpixel 21 to apply a driving voltage for emitting light of a color corresponding to the first subpixel 21.

The second transistor 32 according to one example may be connected to a second sub electrode 52 arranged on the second subpixel 22 to apply a driving voltage for emitting light of a color corresponding to the second subpixel 22.

The third transistor 33 according to one example may be connected to a third sub electrode 53 arranged on the third subpixel 23 to apply a driving voltage for emitting light of a color corresponding to the third subpixel 23.

The fourth transistor 34 according to one example may be connected to a fourth sub electrode 54 arranged on the fourth subpixel 24 to apply a driving voltage for emitting light of a color corresponding to the fourth subpixel 24.

Each of the first subpixel 21, the second subpixel 22, the third subpixel 23, and the fourth subpixel 24 according to one example supplies a predetermined current to an organic light emitting layer in accordance with the data voltage of the data line when a gate signal from the gate line is input thereto using each of the transistors 31, 32, 33 and 34. For this reason, the organic light emitting layer of each of the first subpixel 21, the second subpixel 22, the third subpixel 23 and the fourth subpixel 24 may emit light with a predetermined brightness in accordance with the predetermined current.

The circuit element layer 3 may include an insulating layer 3a covering the transistors 31, 32, 33 and 34, and a planarization layer 3b covering the insulating layer 3a. The insulating layer 3a is to prevent the respective transistors 31, 32, 33 and 34 from being in contact with each other. The planarization layer 3b may be formed to have an upper surface which is planarized so that the first electrode 5 and the substrate 2 are arranged in parallel. The color filter layer 4 may be formed in the planarization layer 3b.

The color filter layer 4 includes a first color filter 41 of a red color R arranged to correspond to the first subpixel 21, a second color filter 42 of a green color G arranged to correspond to the second subpixel 22, and a third color filter 43 of a blue color B arranged to correspond to the third subpixel 23. Since the fourth subpixel 24 is provided to emit white light, a color filter is not arranged there and therefore white light W emitted from the organic light emitting layer 10 is emitted from the fourth subpixel 24 as it is.

When the organic light emitting layer 10 is provided to emit white light, in the first subpixel 21, white light emitted from the organic light emitting layer 10 passes through the first color filter 41 of the red color, whereby only the red light transmits the first subpixel 21. In the second subpixel 22, white light emitted from the organic light emitting layer 10 passes through the second color filter 42 of the green color, whereby only the green light transmits the second subpixel 22. In the third subpixel 23, white light emitted from the organic light emitting layer 10 passes through the third color filter 43 of the blue color, whereby only the blue light transmits the third subpixel 23.

When the organic light emitting layer 10, as shown in FIG. 1, is provided to emit red light, green light, blue light and white light for each of the first to fourth subpixels 21, 22, 23 and 24, each of the first to third color filters 41, 42 and 43 may enhance color purity of each light emitted from the organic light emitting layer 10.

The first electrode 5 is formed on the circuit element layer 3. In more detail, the first electrode 5 may be formed on the upper surface of the planarization layer 3b. The first electrode 5 according to one example may be made of a transparent material such as ITO. The first electrode 5 may be an anode. The first electrode 5 may include a first sub electrode 51, a second sub electrode 52, a third sub electrode 53, and a fourth sub electrode 54.

The first sub electrode 51 may be provided on the first subpixel 21. The first sub electrode 51 may be formed on the planarization layer 3b of the circuit element layer 3 arranged on the first subpixel 21. The first sub electrode 51 is connected to a source electrode of the first transistor 31 through a contact hole that passes through the planarization layer 3b and the insulating layer 3a.

The second sub electrode 52 may be provided on the second subpixel 22. The second sub electrode 52 may be formed on the planarization layer 3b of the circuit element layer 3 arranged on the second subpixel 22. The second sub electrode 52 is connected to a source electrode of the second transistor 32 through a contact hole that passes through the planarization layer 3b and the insulating layer 3a.

The third sub electrode 53 may be provided on the third subpixel 23. The third sub electrode 53 may be formed on the planarization layer 3b of the circuit element layer 3 arranged on the third subpixel 23. The third sub electrode 53 is connected to a source electrode of the third transistor 33 through a contact hole that passes through the planarization layer 3b and the insulating layer 3a.

The fourth sub electrode 54 may be provided on the fourth subpixel 24. The fourth sub electrode 54 may be formed on the planarization layer 3b of the circuit element layer 3 arranged on the fourth subpixel 24. The fourth sub electrode 54 is connected to a source electrode of the fourth transistor 34 through a contact hole that passes through the planarization layer 3b and the insulating layer 3a.

In this case, the first to fourth transistors 31, 32, 33 and 34 may be N-type TFTs.

If the first to fourth transistors 31, 32, 33 and 34 are made of P-type TFTs, each of the first to fourth sub electrodes 51, 52, 53 and 54 may be connected to a drain electrode of each of the first to fourth transistors 31, 32, 33 and 34.

In other words, each of the first to fourth sub electrodes 51, 52, 53 and 54 may be connected to a source electrode or a drain electrode in accordance with types of the first to fourth transistors 31, 32, 33 and 34.

Referring to FIG. 2 again, the first sub electrode 51 may include a planarization electrode 511, a reflective metal 512, and an auxiliary electrode 513. The planarization electrode 511 is arranged on a top surface of the circuit element layer 3 and is in contact with the light absorption portion 9. In more detail, the planarization electrode 511 may be in contact with a lower surface of the light absorption portion 91 arranged in the first subpixel 21. Edges of the planarization electrode 511 may be covered by the first bank 6 and another bank adjacent to the first bank 6. Therefore, the planarization electrode 511 may be in contact with the lower surface of the light absorption portion 91 and a lower surface of the first bank 6. The planarization electrode 511 may be made of a transparent material to be transmitted by light.

The reflective metal 512 may be formed to cover the light absorption portion 91 formed on the planarization electrode 511. The reflective metal 512 may reflect light emitted from the organic light emitting layer 10 toward the substrate 2 or the second electrode 11. The reflective metal 512 may be made of a material containing ITO and Ag to enhance adhesion with the light absorption portion 91 while reflecting light. The reflective metal 512 may be provided to maintain a certain interval with the second electrode 11 to maintain an optical distance with the second electrode 11. In this case, the optical distance means an interval between the reflective metal 512 and the second electrode 11 to reflect and re-reflect light emitted from the organic light emitting layer 10. For example, the reflective metal 512 and the second electrode 11 are arranged to have a first interval G1 (shown in FIG. 3), and the first interval G1 may be 50 nm or more and 2000 or less. If the interval between the reflective metal and the second electrode is less than 50 nm, lifespan of the organic light emitting layer 10 may be reduced. If the interval between the reflective metal and the second electrode exceeds 2000 nm, a driving voltage may be increased.

The auxiliary electrode 513 may be arranged between the organic light emitting layer 10 and the reflective metal 512. The auxiliary electrode 513 is to match a work function with that of the second electrode 11. The auxiliary electrode 513 may be formed to cover the reflective metal 512. Therefore, one end of the auxiliary electrode 513 may be in contact with the planarization electrode 511. As the auxiliary electrode 513 is in contact with the planarization electrode 511, a voltage may be applied from the first transistor 31 to the auxiliary electrode 513, whereby the auxiliary electrode 513 may form an electric field with the second electrode 11.

The auxiliary electrode 513 may be made of the same metal material as that of the planarization electrode 511. Therefore, as the auxiliary electrode 513 and the planarization electrode 511 have the same work function, non-uniform luminance per contact position of the organic light emitting layer 10 may be avoided. The auxiliary electrode 513 and the planarization electrode 511 may be made of a transparent metal material of a thin thickness.

Meanwhile, as shown in FIG. 3, the first interval G1 may be greater than a second interval G2 which is an interval between the second electrode 11 and the planarization electrode 511. This is to prevent non-uniform luminance from occurring by uniformly forming an electric field between the first electrode 5 and the second electrode 11 as the interval between the second electrode 11 and the planarization electrode 511 and the interval between the second electrode 11 and the auxiliary electrode 513, which will be described later, are formed at the same interval. That is, the first sub electrode 51 may be arranged in parallel with the second electrode 11 to prevent non-uniform luminance from occurring in the first subpixel 21.

Referring to FIG. 2, the second sub electrode 52 may include a planarization electrode 521, a reflective metal 522, and an auxiliary electrode 523. The planarization electrode 521 may be arranged on the top surface of the circuit element layer 3 and be in contact with the lower surface of the light absorption portion 92 arranged in the second subpixel 22. Edges of the planarization electrode 521 may be covered by the first bank 6 and the second bank 7. Therefore, the planarization electrode 521 may be in contact with the lower surface of the light absorption portion 92, the lower surface of the first bank 6 and a lower surface of the second bank 7. The reflective metal 522 may be formed to cover the light absorption portion 92 formed on the planarization electrode 521, and may reflect light emitted from the organic light emitting layer 10 toward the substrate 2 or the second electrode 11. The reflective metal 522 may be made of the same material as that of the reflective metal 512 arranged on the first subpixel 21. The reflective metal 522 may be provided to maintain a certain interval with the second electrode 11 to maintain an optical distance with the second electrode 11. In this case, the optical distance of the reflective metal 522 and the second electrode 11 may be equal to the first interval G1.

The auxiliary electrode 523 is to match a work function with that of the second electrode 11, and may be arranged between the organic light emitting layer 10 and the reflective metal 522. One end of the auxiliary electrode 523 may be in contact with the planarization electrode 521 while covering the reflective metal 522. As the auxiliary electrode 523 is in contact with the planarization electrode 521, a voltage may be applied from the second transistor 32 to the auxiliary electrode 523, whereby the auxiliary electrode 523 may form an electric field with the second electrode 11. The auxiliary electrode 523 may be made of the same metal material as that of the planarization electrode 521. Therefore, as the auxiliary electrode 523 and the planarization electrode 521 have the same work function, non-uniform luminance per contact position of the organic light emitting layer 10 may be avoided. The auxiliary electrode 523 and the planarization electrode 521 may transparently be formed of a metal material at a thin thickness in spite of the metal material. Also, the second sub electrode 52 may be arranged in parallel with the second electrode 11 to prevent non-uniform luminance from occurring in the second subpixel 22.

The third sub electrode 53 may include a planarization electrode 531, a reflective metal 532, and an auxiliary electrode 533. The planarization electrode 531 may be arranged on the top surface of the circuit element layer 3 and be in contact with the lower surface of the light absorption portion 93 arranged in the third subpixel 23. Edges of the planarization electrode 531 may be covered by the second bank 7 and the third bank 8. Therefore, the planarization electrode 531 may be in contact with the lower surface of the light absorption portion 93, the lower surface of the second bank 7 and a lower surface of the third bank 8.

The reflective metal 532 may be formed to cover the light absorption portion 93 formed on the planarization electrode 531, and may reflect light emitted from the organic light emitting layer 10 toward the substrate 2 or the second electrode 11. The reflective metal 532 may be made of the same material as that of the reflective metal 512 arranged in the first subpixel 21. The reflective metal 532 may be provided to maintain a certain interval with the second electrode 11 to maintain an optical distance with the second electrode 11. The optical distance between the reflective metal 532 and the second electrode 11 may be equal to the first interval G1.

The auxiliary electrode 533 is to match a work function with that of the second electrode 11, and may be arranged between the organic light emitting layer 10 and the reflective metal 532. One end of the auxiliary electrode 533 may be in contact with the planarization electrode 531 while covering the reflective metal 532. As the auxiliary electrode 533 is in contact with the planarization electrode 531, a voltage may be applied from the third transistor 33 to the auxiliary electrode 533, whereby the auxiliary electrode 533 may form an electric field with the second electrode 11. The auxiliary electrode 533 may be made of the same metal material as that of the planarization electrode 531. Therefore, as the auxiliary electrode 533 and the planarization electrode 531 have the same work function, non-uniform luminance per contact position of the organic light emitting layer 10 may be avoided. The auxiliary electrode 533 and the planarization electrode 531 may transparently be formed of a metal material of a thin thickness in spite of the metal material. Also, the third sub electrode 53 may be arranged in parallel with the second electrode 11 to prevent non-uniform luminance from occurring in the third subpixel 23.

The fourth sub electrode 54 may include a planarization electrode 541, a reflective metal 542, and an auxiliary electrode 543. The planarization electrode 541 may be arranged on the top surface of the circuit element layer 3 and be in contact with the lower surface of the light absorption portion 94 arranged in the fourth subpixel 24. Edges of the planarization electrode 541 may be covered by the third bank 8 and another bank adjacent to the third bank 8. Therefore, the planarization electrode 541 may be in contact with the lower surface of the light absorption portion 94, the lower surface of the third bank 8 and a lower surface of another bank adjacent to the third bank 8. The reflective metal 542 may be formed to cover the light absorption portion 94 formed on the planarization electrode 541, and may reflect light emitted from the organic light emitting layer 10 toward the substrate 2 or the second electrode 11. The reflective metal 542 may be made of the same material as that of the reflective metal 512 arranged in the first subpixel 21. The reflective metal 542 may be provided to maintain a certain interval with the second electrode 11 to maintain an optical distance with the second electrode 11. The optical distance between the reflective metal 542 and the second electrode 11 may be equal to the first interval G1.

The auxiliary electrode 543 is to match a work function with that of the second electrode 11, and may be arranged between the organic light emitting layer 10 and the reflective metal 542. One end of the auxiliary electrode 543 may be in contact with the planarization electrode 541 while covering the reflective metal 542. As the auxiliary electrode 543 is in contact with the planarization electrode 541, a voltage may be applied from the fourth transistor 34 to the auxiliary electrode 543, whereby the auxiliary electrode 543 may form an electric field with the second electrode 11. The auxiliary electrode 543 may be made of the same metal material as that of the planarization electrode 541. Therefore, as the auxiliary electrode 543 and the planarization electrode 541 have the same work function, non-uniform luminance per contact position of the organic light emitting layer 10 may be avoided. The auxiliary electrode 543 and the planarization electrode 541 may transparently be formed of a metal material of a thin thickness in spite of the metal material. Also, the fourth sub electrode 54 may be arranged in parallel with the second electrode 11 to prevent non-uniform luminance from occurring in the fourth subpixel 24.

Since the display device 1 according to one embodiment of the present disclosure is provided in a bottom emission method, each of the first to fourth sub electrodes 51, 52, 53 and 54 may include reflective metals 512, 522, 532 and 542 for reflecting light emitted from the organic light emitting layer 10 toward a lower portion as described above.

In this case, the reflective metals 512, 522, 532 and 542 respectively provided in the first to fourth subpixels 21, 22, 23 and 24 may be formed to have the same thickness. The reflective metals 512, 522, 532 and 542 may be made of, but not limited to, an alloy of ITO and Ag.

Meanwhile, the planarization electrode 511 of the first sub electrode 51 may be arranged on the lower surface of the light absorption portion 91, and one end of each of the reflective metal 512 and the auxiliary electrode 513 may be in contact with the planarization electrode 511 while covering the light absorption portion 91. As a result, the light absorption portion 91 is surrounded by the planarization electrode 511 and the reflective metal 512, the light absorption portion 91 may be arranged inside the first sub electrode 51. Likewise, the light absorption portion 92 arranged in the second subpixel 22 may be arranged inside the second sub electrode 52, the light absorption portion 93 arranged in the third subpixel 23 may be arranged inside the third sub electrode 53, and the light absorption portion 94 arranged in the fourth subpixel 24 may be arranged inside the fourth sub electrode 54.

Referring to FIG. 2 again, the first bank 6 is provided between the first sub electrode 51 and the second sub electrode 52. The first bank 6 according to one example is to partition the first subpixel 21 and the second subpixel 22 from each other. The first bank 6 may be provided to cover edges of each of the first sub electrode 51 and the second sub electrode 52, thereby partitioning the first subpixel 21 and the second subpixel 22 from each other. The first bank 6 serves to define a subpixel, that e.g., a light emitting area. Also, an area where the first bank 6 is formed may be defined as a non-light emitting area because the area does not emit light. Therefore, the first transistor 31 may be arranged in the circuit element layer 3 to correspond to the first bank 6. As the first transistor 31 is arranged to correspond to the first bank 6, the first transistor 31 may apply a voltage to the first sub electrode 51 without covering a light emitting area of the first subpixel 21.

The first bank 6 may be formed of an organic film such as acryl resin, epoxy resin, phenolic resin, polyamide resin, and polyimide resin. The organic light emitting layer 10 is formed on the first electrode 5 and the first bank 6.

The first bank 6 may include an upper surface 61 and an inclined surface 62. The inclined surface 62 may include a first inclined surface 621 and a second inclined surface 622.

The upper surface 61 of the first bank 6 is a surface placed on the top of the first bank 6.

The first inclined surface 621 of the first bank 6 is a surface extended from the upper surface 61 to an upper surface 51a of the first sub electrode 51. Therefore, the first inclined surface 621 may have a predetermined angle with the upper surface 51a of the first sub electrode 51. The predetermined angle may be greater than 50° and less than 90° as a width of the bank becomes narrow in accordance with high resolution of the display device. However, without limitation to this case, the predetermined angle may be provided at an angle lower than 50°. The width of the bank may become narrow as the distance between subpixels becomes narrow.

The second inclined surface 622 of the first bank 6 is a surface extended from the upper surface 61 to an upper surface 52a of the second sub electrode 52. Therefore, the second inclined surface 622 may have a predetermined angle with the upper surface 52a of the second sub electrode 52. The angle between the second inclined surface 622 and the upper surface 52a of the second sub electrode 52 may be equal to the angle between the first inclined surface 621 and the upper surface 51a of the first sub electrode 51.

Referring to FIG. 2, the display device 1 according to one embodiment of the present disclosure may further include a second bank 7 and a third bank 8.

The second bank 7 is provided between the second sub electrode 52 and the third sub electrode 53. The second bank 7 according to one example may be provided to cover edges of each of the second sub electrode 52 and the third sub electrode 53, thereby partitioning the second subpixel 22 and the third subpixel 23 from each other. The second bank 7 serves to define a subpixel, e.g., a light emitting area. Also, an area where the second bank 7 is formed may be defined as a non-light emitting area because the area does not emit light. The second transistor 32 may be arranged in the circuit element layer 3 to correspond to the second bank 7. As the second transistor 32 is arranged to correspond to the second bank 7, the second transistor 32 may apply a voltage to the second sub electrode 52 without covering the light emitting area of the second subpixel 22. The second bank 7 may be formed of the same material as that of the first bank 6. The organic light emitting layer 10 is partially formed on the first electrode 5 and the second bank 7.

The second bank 7 may include an upper surface 71 and an inclined surface 72. The inclined surface 72 may include a first inclined surface 721 and a second inclined surface 722.

The upper surface 71 of the second bank 7 is a surface placed on the top of the second bank 7.

The first inclined surface 721 of the second bank 7 is a surface extended from the upper surface 71 to the upper surface 52a of the second sub electrode 52. Therefore, the first inclined surface 721 may have a predetermined angle with the upper surface 52a of the second sub electrode 52. The predetermined angle may be greater than 50° and less than 90° as a width of the bank becomes narrow in accordance with high resolution of the display device. However, without limitation to this case, the predetermined angle may be provided at an angle lower than 50°.

The second inclined surface 722 of the second bank 7 is a surface extended from the upper surface 71 to an upper surface 53a of the third sub electrode 53. Therefore, the second inclined surface 722 may have a predetermined angle with the upper surface 53a of the third sub electrode 53. The angle between the second inclined surface 722 and the upper surface 53a of the third sub electrode 53 may be equal to the angle between the first inclined surface 721 and the upper surface 52a of the second sub electrode 52.

The third bank 8 is provided between the third sub electrode 53 and the fourth sub electrode 54. The third bank 8 according to one example may be provided to cover edges of each of the third sub electrode 53 and the fourth sub electrode 54, thereby partitioning the third subpixel 23 and the fourth subpixel 24 from each other. The third bank 8 serves to define a subpixel, e.g., a light emitting area. Also, an area where the third bank 8 is formed may be defined as a non-light emitting area because the area does not emit light. The third transistor 33 may be arranged in the circuit element layer 3 to correspond to the third bank 8. As the third transistor 33 is arranged to correspond to the third bank 8, the third transistor 33 may apply a voltage to the third sub electrode 53 without covering the light emitting area of the third subpixel 23. The third bank 8 may be formed of the same material as that of the first bank 6. The organic light emitting layer 10 is partially formed on the first electrode 5 and the third bank 8.

The third bank 8 may include an upper surface 81 and an inclined surface 82. The inclined surface 82 may include a first inclined surface 821 and a second inclined surface 822.

The upper surface 81 of the third bank 8 is a surface placed on the top of the third bank 8.

The first inclined surface 821 of the third bank 8 is a surface extended from the upper surface 81 to the upper surface 53a of the third sub electrode 53. Therefore, the first inclined surface 821 may have a predetermined angle with the upper surface 53a of the third sub electrode 53. The predetermined angle may be greater than 50° and less than 90° as a width of the bank becomes narrow in accordance with high resolution of the display device. However, without limitation to this case, the predetermined angle may be provided at an angle lower than 50°.

The second inclined surface 822 of the third bank 8 is a surface extended from the upper surface 81 to an upper surface 54a of the fourth sub electrode 54. Therefore, the second inclined surface 822 may have a predetermined angle with the upper surface 54a of the fourth sub electrode 54. The angle between the second inclined surface 822 and the upper surface 54a of the fourth sub electrode 54 may be equal to the angle between the first inclined surface 821 and the upper surface 53a of the third sub electrode 53.

Meanwhile, the fourth transistor 34 may be arranged to correspond to a bank adjacent to the third bank 8. As the fourth transistor 34 is arranged to correspond to a bank adjacent to the third bank 8, the fourth transistor 34 may apply a voltage to the fourth sub electrode 54 without covering the light emitting area of the fourth subpixel 24.

The light absorption portion 9 may be arranged inside the first electrode 5. For example, the light absorption portion 91 of the first subpixel 21 may be surrounded by the planarization electrode 511 and the reflective metal 512. The light absorption portion 9 may be made of a material that absorbs light, thereby absorbing light (hereinafter, referred to as 'external light') externally entering the display device 1. As the light absorption portion 9 absorbs the external light, a user who views the display device 1 above the color filter layer 4 may avoid dazzling caused by reflection of the external light. That is, in the display device 1 according to one embodiment of the present disclosure, the light absorption portion 9 may be arranged below the color filter layer 4 to reduce reflectivity of the external light. For example, supposing that reflectivity of the external light is 100% if a polarizer is not provided, reflectivity of the external light in the display device 1 of the present disclosure may be 20% or more and 75% or less.

The light absorption portion 9 may be arranged below the reflective metals 512, 522, 532 and 542 of the first electrode 5 so as not to absorb light emitted from the organic light emitting layer 10. As described above, the auxiliary electrodes 513, 523, 533 and 543 may be arranged between the reflective metals 512, 522, 532 and 542 and the organic light emitting layer 10. Therefore, as the reflective metals 512, 522, 532 and 542 and the auxiliary electrodes 513, 523, 533 and 543 may be arranged between the light absorption portion 9 and the organic light emitting layer 10, light emitted from the organic light emitting layer 10 may be reflected by the reflective metal 512, 522, 532 and 542 without being absorbed by the light absorption portion 9.

The light absorption portion 9 includes a light absorption portion 91 arranged inside the first sub electrode 51, a light absorption portion 92 arranged inside the second sub electrode 52, a light absorption portion 93 arranged inside the third sub electrode 53, and a light absorption portion 94 arranged inside the fourth sub electrode 54. Therefore, the light absorption portion 91 arranged in the first sub electrode 51 may absorb external light entering the first subpixel 21, the light absorption portion 92 arranged in the second sub electrode 52 may absorb external light entering the second subpixel 22, the light absorption portion 93 arranged in the third sub electrode 53 may absorb external light entering the third subpixel 23, and the light absorption portion 94 arranged in the fourth sub electrode 54 may absorb external light entering the fourth subpixel 24.

Referring to FIG. 3, a width LAW of the light absorption portion 91 may be provided to be smaller than a width of the first sub electrode 51. In more detail, the width LAW of the light absorption portion 91 may be provided to be smaller than a width AW of the planarization electrode 511 which is not overlapped with the first bank 6 and a bank adjacent to the first bank 6. In this case, the bank adjacent to the first bank 6 may be a bank located at a left side of the first bank 6 based on FIG. 2. Therefore, the width AW of the planarization electrode 511 which is not overlapped with the first bank 6 and a bank adjacent to the first bank 6 may be a light emitting area through which light emitted from the organic light emitting layer 10 is emitted if there is no light absorption portion 91. As a result, the width LAW of the light absorption portion 91 may be smaller than the width AW of the planarization electrode 511 which is not overlapped with the first bank 6 and a bank adjacent to the first bank 6. If the width of the light absorption portion is equal to or greater than the width AW of the planarization electrode 511, since light emitted from the organic light emitting layer is absorbed by the light absorption portion, light emitting efficiency may be reduced. For example, the width LAW of the light absorption portion 91 may be provided to be 1 μm or more and 50 μm or less, and a height LAH of the light absorption portion 91 may be provided to be 10 nm or more and 3000 nm or less. The width LAW and the height LAH of each of the light absorption portion 92 arranged in the second subpixel 22, the light absorption portion 93 arranged in the third subpixel 23 and the light absorption portion 94 arranged in the fourth subpixel 24 may be provided to be equal to the width LAW and the height LAH of the light absorption portion 91 arranged in the first subpixel 21.

Meanwhile, light emitted from the organic light emitting layer 10 between the auxiliary electrode 513 and the second electrode 11 and between the planarization electrode 511 and the second electrode 11 may be emitted to the outside through a portion between the reflective metal 512 and the first bank 6 and a portion between the reflective metal 512 and the aforementioned bank adjacent to the first bank 6. This may equally be applied to the second to fourth subpixels 22, 23 and 24.

The organic light emitting layer 10 may be formed on the first electrode 5. At this time, the organic light emitting layer 10 may cover a portion of each of the first bank 6, the second bank 7 and the third bank 8. The organic light emitting layer 10 may include a hole transporting layer, a light emitting layer, and an electron transporting layer, and may further include a hole injecting layer and an electron injecting layer. The organic light emitting layer 10 may include a first organic light emitting layer 101 arranged on the first subpixel 21, a second organic light emitting layer 102 arranged on the second subpixel 22, a third organic light emitting layer 103 arranged on the third subpixel 23, and a fourth organic light emitting layer 104 arranged on the fourth subpixel 24. The first to fourth organic light emitting layers 101, 102, 103 and 104 may be provided to respectively emit red light, green light, blue light and white light. The first organic light emitting layer 101 may include a red light emitting layer to emit red light, the second organic light emitting layer 102 may include a green light emitting layer to emit green light, and the third organic light emitting layer 103 may include a blue light emitting layer to emit blue light.

The fourth organic light emitting layer 104 may include a plurality of stacks for emitting light of different colors. For example, the fourth organic light emitting layer 104 may include a first stack for emitting blue (B) light, a second stack for emitting yellow-green (YG) light, and a charge generation layer CGL provided between the first stack and the second stack. The first stack may include a first hole transporting layer, a blue light emitting layer, and a first electron transporting layer, which are sequentially deposited, and the second stack may include a second hole transporting layer, a yellow-green light emitting layer, and a second electron transporting layer, which are sequentially deposited. In this case, white light may be emitted by combination of blue light and yellow-green light. However, without limitation to this case, the organic light emitting layer 10 may be provided in such a manner that a first stack for emitting red light, a second stack for emitting green light, a third stack for emitting blue light, a first charge generation layer provided between the first stack and the second stack, and a second charge generation layer provided between the second stack and the third stack are deposited, and may emit white light by combination of red light, green light and blue light.

If a high potential voltage is applied to the first electrode 5 and a low potential voltage is applied to the second electrode 11, holes and electrons move to the light emitting layer through the hole transporting layer and the electron transporting layer, respectively and combined with each other in the light emitting layer to emit light.

Referring to FIG. 2, the second electrode 11 is arranged on the organic light emitting layer 10. The second electrode 11 according to one embodiment is a common layer commonly formed on the first subpixel 21, the second subpixel 22, the third subpixel 23 and the fourth subpixel 24. Since the display device 1 according to one embodiment of the present disclosure is provided in a bottom emission method in which light emitted from the organic light emitting layer 10 is emitted toward the substrate 2, the second electrode 11 may be made of an opaque material that may reflect light. For example, the second electrode 11 may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). Therefore, the second electrode 11 may reflect light emitted from the organic light emitting layer 10 toward the substrate 2.

As a result, in the display device 1 according to one embodiment of the present disclosure, the second electrode 11 arranged above the organic light emitting layer 10 may be made of an opaque material, and the first electrode 5 and the substrate 2, which are arranged below the organic light emitting layer 10 may be made of a transparent material. In this case, despite that the reflective metals 512, 522, 532 and 542 of the first electrode 5 are arranged below the organic light emitting layer 10, the reflective metals 512, 522, 532 and 542 may be made of an opaque material to reflect and re-reflect light together with the second electrode 11. Therefore, the first electrode 5 arranged below the organic light emitting layer 10 may mean the planarization electrode 511 and the auxiliary electrode 513 except the reflective metals 512, 522, 532 and 542.

The encapsulation layer 12 may be formed on the second electrode 11. The encapsulation layer 12 serves to prevent oxygen or water from being permeated into the organic light emitting layer 10 and the second electrode 11. To this end, the encapsulation layer 12 may include at least one inorganic film and at least one organic film.

For example, the encapsulation layer 12 may include a first inorganic film, an organic film, and a second inorganic film. In this case, the first inorganic film is formed to cover the second electrode 11. The organic film is formed to cover the first inorganic film. It is preferable that the organic film is formed at a length long enough to prevent particles from being permeated into the organic light emitting layer 10 and the second electrode 11 by passing through the first inorganic film. The second inorganic film may be formed to cover the organic film.

Since the encapsulation layer 12 is arranged to cover the second electrode 11, and the second electrode 11 is formed of an opaque material as described above and reflects light emitted from the organic light emitting layer 10, the light emitted from the organic light emitting layer 10 may not enter the encapsulation layer 12. Therefore, the display device 1 according to one embodiment of the present disclosure may be embodied in a bottom emission method.

FIGS. 4A to 4E are cross-sectional views illustrating a brief manufacturing process of a display device according to one embodiment of the present disclosure. In the display device 1 according to one embodiment of the present disclosure, through the following manufacturing process, after the light absorption portion 9 for absorbing external light is formed inside the first electrode 5, the reflective metals 512, 522, 532 and 542 and the auxiliary electrodes 513, 523, 533 and 543 may be formed above the light absorption portion 9.

Referring to FIG. 4A, the first to fourth transistors 31, 32, 33 and 34 are formed on the substrate 2, and the first to third color filters 41, 42 and 43 are formed on the insulating layer 3a of the circuit element layer 3 to respectively correspond to the first to third subpixels 21, 22 and 23.

A portion of each of the first to third color filters 41, 42 and 43 may be arranged to respectively overlap the first to third banks 6, 7 and 8. In this case, the portion of the first to third color filters 41, 42 and 43 may mean an edge of each of the first to third color filters 41, 42 and 43. As the edge of each of the first to third color filters 41, 42 and 43 is arranged to overlap the first to third banks 6, 7 and 8, light emitted from each of the first to third subpixels 21, 22 and 23 may pass through each of the first to third color filters 41, 42 and 43. That is, the color filters may prevent light from being emitted to the outside without passing therethrough.

If the fourth subpixel 24 is provided to emit white light, the fourth subpixel 24 may not be provided with a color filter. Next, after the planarization electrodes 511, 521, 531 and 541 are formed on the planarization layer 3b, the first to third banks 6, 7 and 8 are formed to cover edges of each of the planarization electrodes 511, 521, 531 and 541. Next, the light absorption portion 9 is arranged on the planarization electrodes 511, 521, 531 and 541 which are not covered by the first to third banks 6, 7 and 8. Although FIG. 4A shows that only one light absorption portion 9 is formed on each of the planarization electrodes 511, 521, 531 and 541, a plurality of light absorption portions 9 may be arranged to be spaced apart from one another without being limited to the example of FIG. 4A.

Figure 4B:
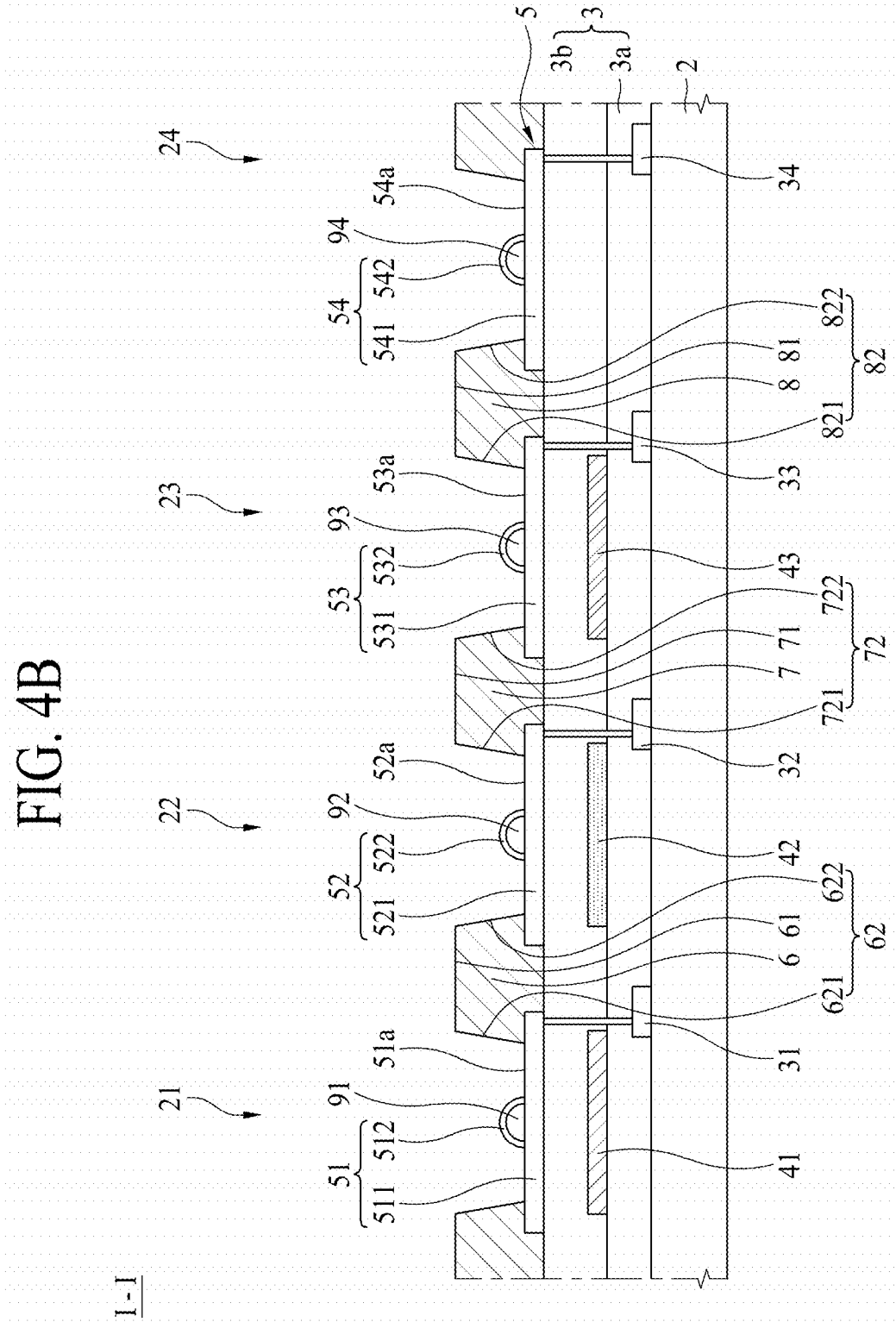

Next, with reference to FIGS. 4B and 4C, the reflective metals 512, 522, 532 and 543 and the auxiliary electrodes 513, 523, 533 and 543 are sequentially formed to cover the light absorption portion 9. The reflective metals 512, 522, 532 and 542 and the auxiliary electrodes 513, 523, 533 and 543 are fully deposited on the first to fourth subpixels 21, 22, 23 and 24 and then patterned, or may be deposited to cover only the light absorption portion 9. The reflective metals 512, 522, 532 and 542 may be made of an opaque material to reflect light, and the auxiliary electrodes 513, 523, 533 and 543 may be made of a transparent material to transmit light.

Figure 4D:
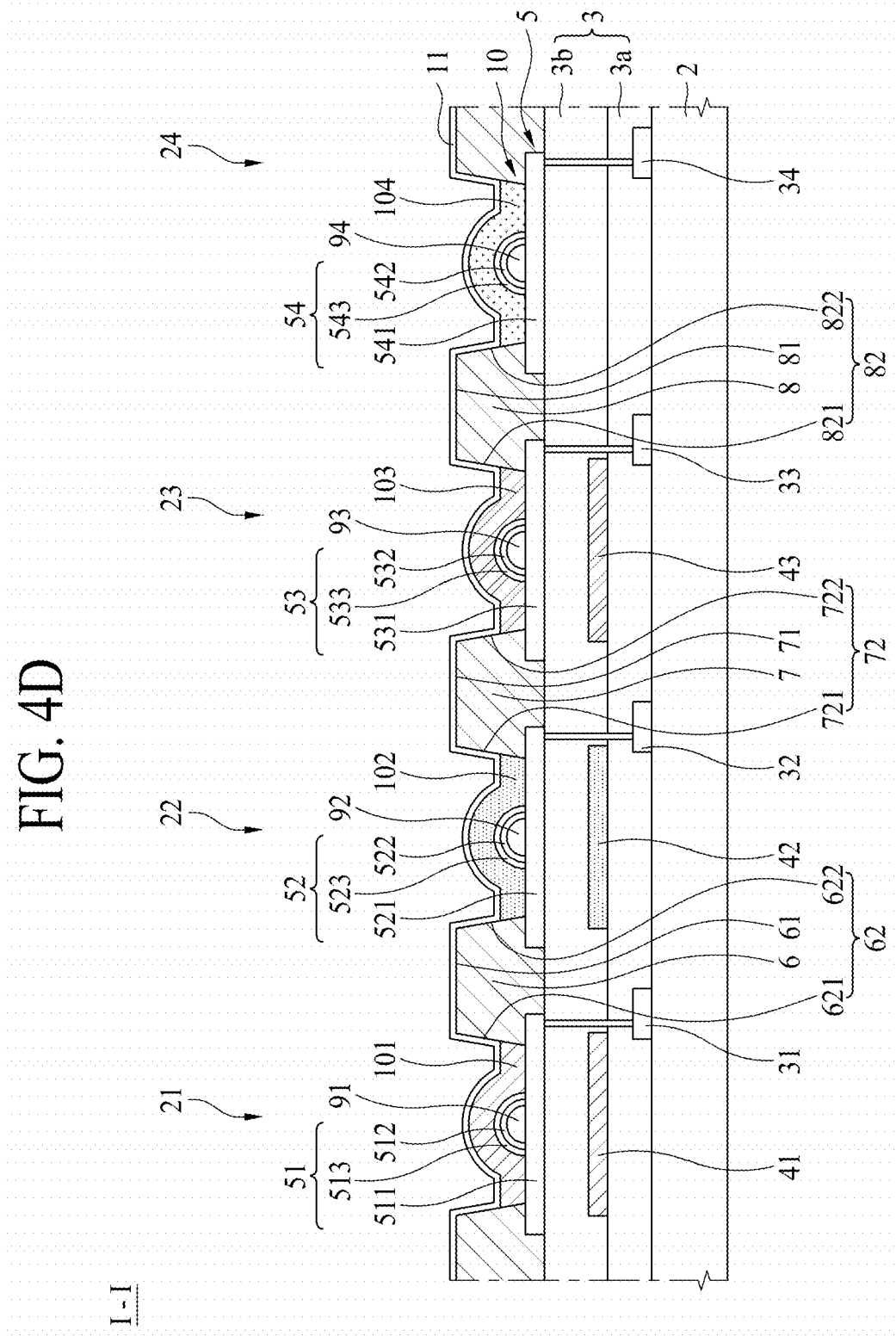

Next, with reference to FIG. 4D, the organic light emitting layer 10 and the second electrode 11 are sequentially formed. The organic light emitting layer 10, as shown in FIG. 4D, may be deposited for each of the first to fourth subpixels 21, 22, 23 and 24, but may be deposited for all of the first to fourth subpixels 21, 22, 23 and 24 and thus provided as a common layer. If the organic light emitting layer 10 is arranged for each of the first to fourth subpixels 21, 22, 23 and 24, the organic light emitting layer 10 may be provided to respectively emit red light, green light, blue light and white light. If the organic light emitting layer 10 is provided as a common layer, the organic light emitting layer 10 may be provided to emit white light.

Next, the second electrode 11 may be deposited as a common layer to cover the organic light emitting layer 10 and the plurality of banks including the first to third banks 6, 7 and 8. In this case, the second electrode 11 may be formed of an opaque material to reflect light emitted from the organic light emitting layer 10 toward the substrate 2. The second electrode 11 may be provided in parallel with the planarization electrodes 511, 521, 531 and 541 and the auxiliary electrodes 513, 523, 533 and 543 at the same interval as that of each of the planarization electrodes 511, 521, 531 and 541 and the auxiliary electrodes 513, 523, 533 and 543 to match a work function with that of each of the planarization electrodes 511, 521, 531 and 541 and the auxiliary electrodes 513, 523, 533 and 543.

Figure 4E:
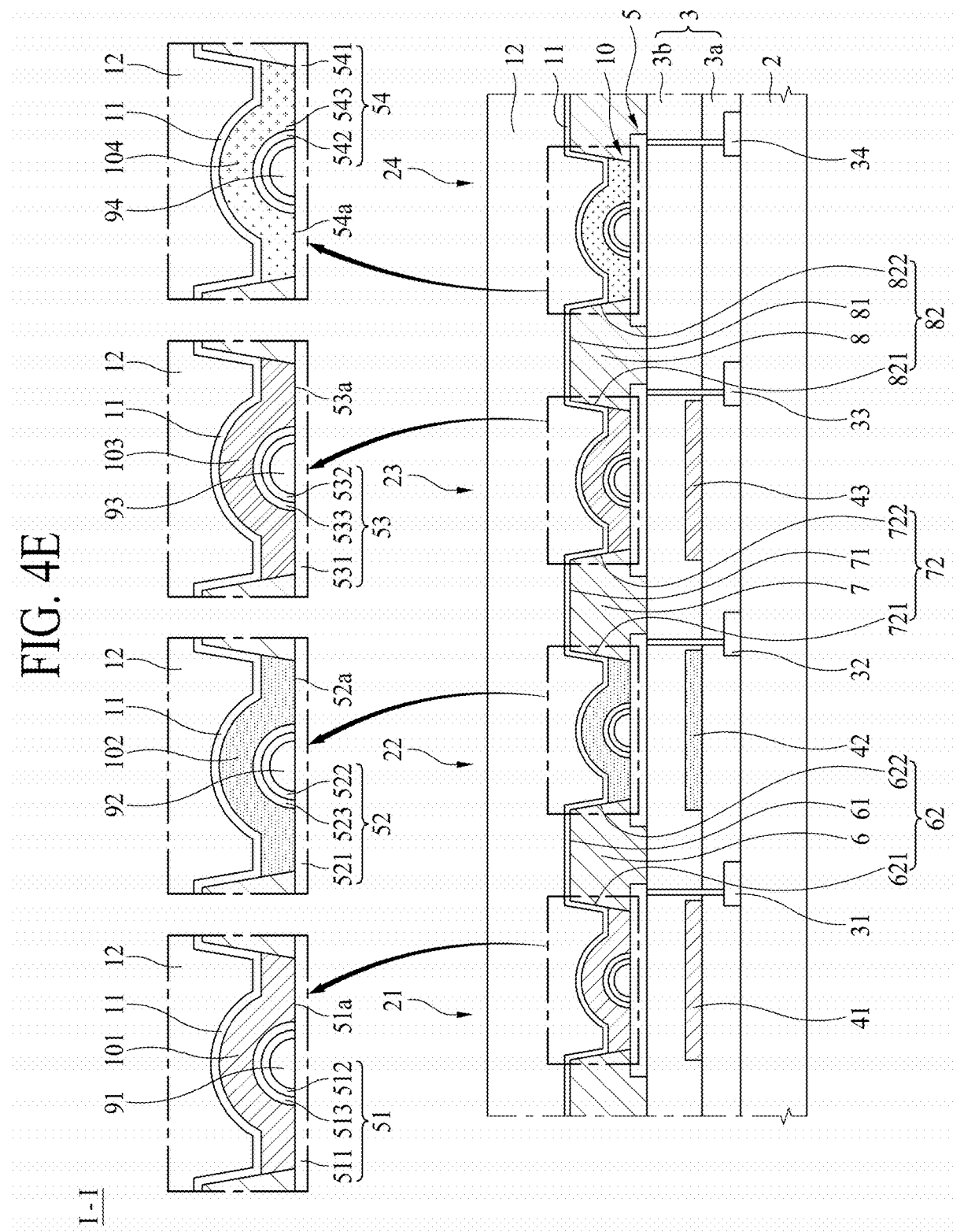

Next, with reference to FIG. 4E, the encapsulation layer 12 is formed to cover the second electrode 11. The encapsulation layer 12 may be provided with a deposited structure of at least one inorganic film and at least one organic film. Therefore, the manufacturing process of the display device 1 according to one embodiment of the present disclosure may partially be completed.

As a result, the display device 1 according to one embodiment of the present disclosure is embodied to lower external light reflectivity by arranging the light absorption portion 9 inside the first electrode 5 or above the color filter layer 4 and reflect and re-reflect light emitted from the organic light emitting layer 10 through the reflective metals 512, 522, 532 and 542 and the second electrode 11 arranged above and below the organic light emitting layer 10. Therefore, light emitting efficiency may be more improved than the case that the polarizer is provided on the organic light emitting layer. For example, if the polarizer is provided on the organic light emitting layer, light emitting efficiency is 50%, whereas the display device 1 of the present disclosure may have light emitting efficiency of at least 68% or more.

FIG. 5 is a brief cross-sectional view taken along line II-II shown in FIG. 1. In more detail, FIG. 5 is a cross-sectional view briefly illustrating a light absorption portion arranged in a Y-axis direction below the light absorption portion arranged on the first subpixel 21 on line I-I shown in FIG. 1.

As shown in FIG. 5, N light absorption portions 91 or more (N is an integer greater than 0) may be arranged on the planarization electrode 511 of the first sub electrode 51. For example, a first light absorption portion 911 and a second light absorption portion 911' may be arranged on the planarization electrode 511 of the first sub electrode 51. In this case, since an absorption rate of external light is greater than the case that only one light absorption portion 91 is provided on the planarization electrode 511, external light reflectivity may be more lowered.

Meanwhile, the reflective metal 512 may be formed to cover the first light absorption portion 911 formed on the planarization electrode 511, and the auxiliary electrode 513 may be formed to cover the reflective metal 512. A reflective metal 512' may be formed to cover the second light absorption portion 911' formed on the planarization electrode 511, and an auxiliary electrode 513' may be formed to cover the reflective metal 512'. The reflective metal 512 covering the first light absorption portion 911 and the auxiliary electrode 513 may be arranged to be spaced apart from the reflective metal 512' covering the second light absorption portion 911' and the auxiliary electrode 513'.

The first light absorption portion 911 and the second light absorption portion 911' may be arranged to be spaced apart from each other. For example, the first light absorption portion 911 and the second light absorption portion 911' may be spaced apart from each other to have a third interval G3. In this case, light emitted from the organic light emitting layer 10 may be emitted to the substrate 2 through a space where the first light absorption portion 911 and the second light absorption portion 911' are spaced apart from each other.

The third interval G3 may be provided to be equal to or greater than the width LAW of the light absorption portion shown in FIG. 3. In this case, since the light absorption portion 91 arranged below the line I-I may be inserted into the space formed between the first light absorption portion 911 and the second light absorption portion 911' arranged below the line II-II, Y-axis directional length of the subpixel shown in FIG. 1 may be more reduced. Therefore, the display device 1 according to one embodiment of the present disclosure may be provided to more easily embody high resolution because the Y-axis directional length of all of the subpixels may be reduced. Likewise, the display device 1 according to one embodiment of the present disclosure may be provided to embody high resolution while reducing its entire size because X-axis directional length may be reduced by the above structure.

Meanwhile, although FIG. 1 illustrates that each of the light absorption portions has a rectangular shape as an example, the light absorption portion may be provided in various shapes such as a circular shape or a triangular shape without limitation to the example of FIG. 1. Also, the height LAH of the light absorption portion, the width LAW of the light absorption portion, and the third interval G3 which is the interval between the light absorption portions may be varied depending on shape, size, etc. of the light absorption portion arranged on one subpixel, especially an area ratio of the light absorption portion 9 occupied in the light emitting area.

Figure 6A:
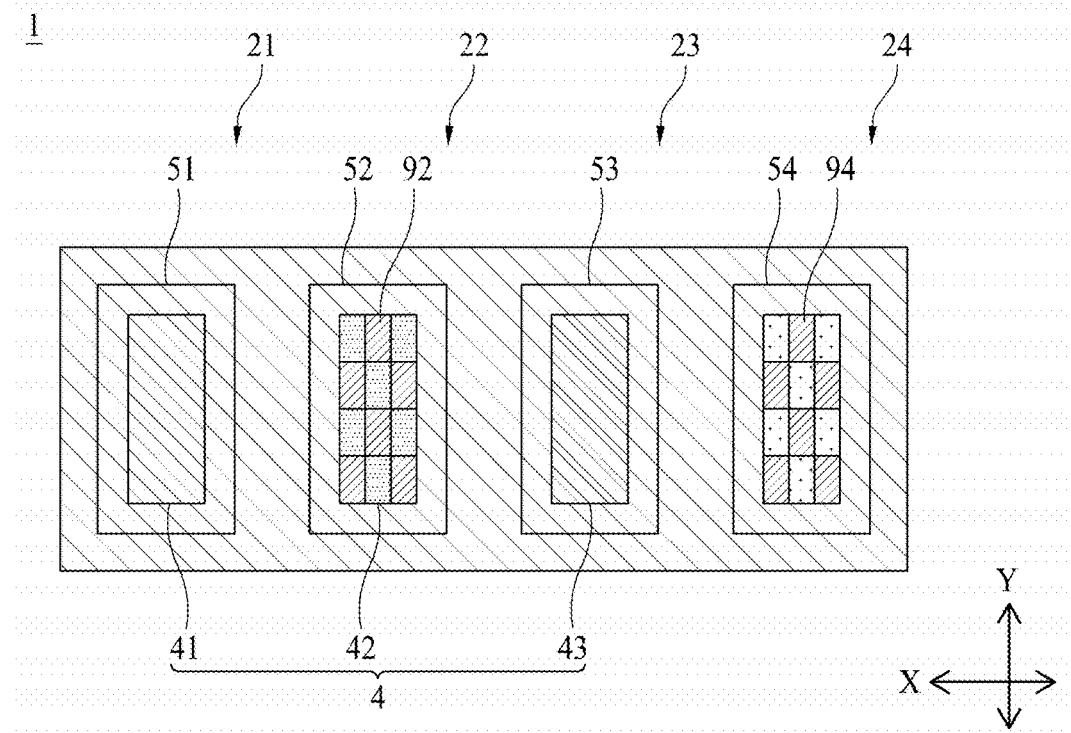
FIGS. 6A and 6B are brief plane views illustrating various embodiments in which a light absorption portion is arranged in a display device according to one embodiment of the present disclosure.
Figure 6B:
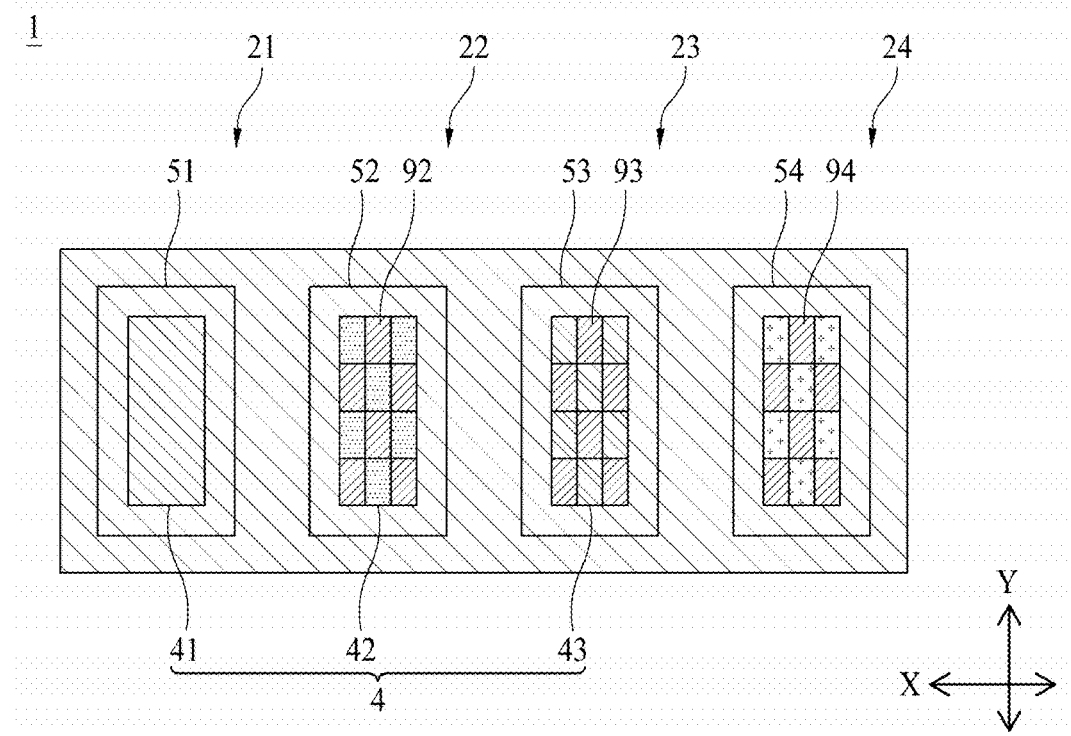

FIGS. 6A and 6B are brief plane views illustrating various embodiments in which a light absorption portion is arranged in a display device according to one embodiment of the present disclosure.

FIG. 6A is another embodiment illustrating that the light absorption portions 92 and 94 are arranged in only the second subpixel 22 and the fourth subpixel 24 when the first to fourth subpixels 21, 22, 23 and 24 are provided to respectively emit red light, green light, blue light and white light. FIG. 1 is different from FIG. 6A in that the light absorption portions 91, 92, 93 and 94 are arranged in all the first to fourth subpixels 21, 22, 23 and 24. As shown in FIG. 6A, the light absorption portions 92 and 94 are arranged in only the second subpixel 22 and the fourth subpixel 24 because the highest visual characteristic of a person is represented at 550 nm and green and white colors have a wavelength of 550 nm. That is, since a person can easily recognize external light if the external light is reflected from the second subpixel 22 and the fourth subpixel 24, the light absorption portions 92 and 94 may be arranged in the second subpixel 22 and the fourth subpixel 24 to lower external light reflectivity. That is, the display device 1 according to one embodiment of the present disclosure may be provided such that the light absorption portions are arranged in the subpixels provided to emit at least green light and white light.

FIG. 6B is still another embodiment illustrating that the light absorption portions 92, 93 and 94 are arranged in the second subpixel 22, the third subpixel 23 and the fourth subpixel 24 and no light absorption portion is arranged in the first subpixel 21 when the first to fourth subpixels 21, 22, 23 and 24 are provided to respectively emit red light, green light, blue light and white light. If the display device is embodied as shown in FIG. 6B, since no light absorption portion is arranged in the first subpixel 21, the display device may be manufactured more easily with a reduced manufacturing cost than FIG. 1. Also, since the light absorption portion 93 is arranged in the third subpixel 23, external light reflectivity may be more reduced than FIG. 6A.

Meanwhile, although the display device 1 according to one embodiment of the present disclosure may be provided with the plurality of light absorption portions arranged in each of the first to fourth subpixels 21, 22, 23 and 24 as an example, only one light absorption portion may be provided in each of the first to fourth subpixels 21, 22, 23 and 24 without limitation to one embodiment of the present disclosure, and may be provided in various shapes such as a rectangular shape, a circular shape and a triangular shape.

The display device 1 according to one embodiment of the present disclosure may be provided such that an area ratio of the light absorption portion 91 occupied in the light emitting area of the first subpixel 21 is 25% or more and 80% or less. In this case, the light emitting area of the first subpixel 21 may be the width AW (shown in FIG. 3) of the planarization electrode 511 which is not overlapped with the first bank 6 and the bank adjacent to the first bank 6, when there is no light absorption portion 91. If the area ratio of the light absorption portion 91 occupied in the light emitting area of the first subpixel 21 is less than 25%, a problem occurs in that the amount of external light absorbed by the light absorption portion 91 is too small, whereby external light reflectivity is high. On the other hand, if the area ratio of the light absorption portion 91 occupied in the light emitting area of the first subpixel 21 exceeds 80%, the amount of external light absorbed by the light absorption portion 91 is increased to enhance external light reflectivity but a problem occurs in that an amount of light emitted from the organic light emitting layer 10 to the substrate 2 is reduced to reduce light emitting efficiency. Therefore, as the display device 1 according to one embodiment of the present disclosure may be provided such that an area ratio of the light absorption portion 91 occupied in the light emitting area of the first subpixel 21 is 25% or more and 80% or less, external light reflectivity may be prevented from being increased and light emitting efficiency may be more improved than the case that the polarizer is provided.

In more detail, in the display device 1 according to one embodiment of the present disclosure, if an area ratio of the light absorption portion 91 occupied in the light emitting area of the first subpixel 21 is 25%, external light reflectivity may be 75% and light emitting efficiency may be 90% as compared with the display device of the related art. If the area ratio of the light absorption portion 91 occupied in the light emitting area of the first subpixel 21 is 50%, external light reflectivity may be 50% and light emitting efficiency may be 80% as compared with the display device of the related art. If the area ratio of the light absorption portion 91 occupied in the light emitting area of the first subpixel 21 is 80%, external light reflectivity may be 20% and light emitting efficiency may be 68% as compared with the display device of the related art. In this case, the display device of the related art may be a structure that the reflective metal 512, the auxiliary electrode 513 and the light absorption portion 9 are removed from the display device 1 of the present disclosure. In the display device of the related art, if the polarizer is provided below the color filter, external light reflectivity may be lowered but a problem may occur in that light emitting efficiency is lowered to 50%. As a result, in the display device 1 according to one embodiment of the present disclosure, external light reflectivity is almost equivalent to the case that polarizer is provided in the display device of the related art but light emitting efficiency may be improved based on that the area ratio of the light absorption portion 91 occupied in the light emitting area of the first subpixel 21 is 50%.

Meanwhile, an area ratio of the light absorption portion 92 occupied in the light emitting area of the second subpixel 22, an area ratio of the light absorption portion 93 occupied in the light emitting area of the third subpixel 23, and an area ratio of the light absorption portion 94 occupied in the light emitting area of the fourth subpixel 24 may be equal to the area ratio of the light absorption portion 91 occupied in the light emitting area of the first subpixel 21.

Figure 7:
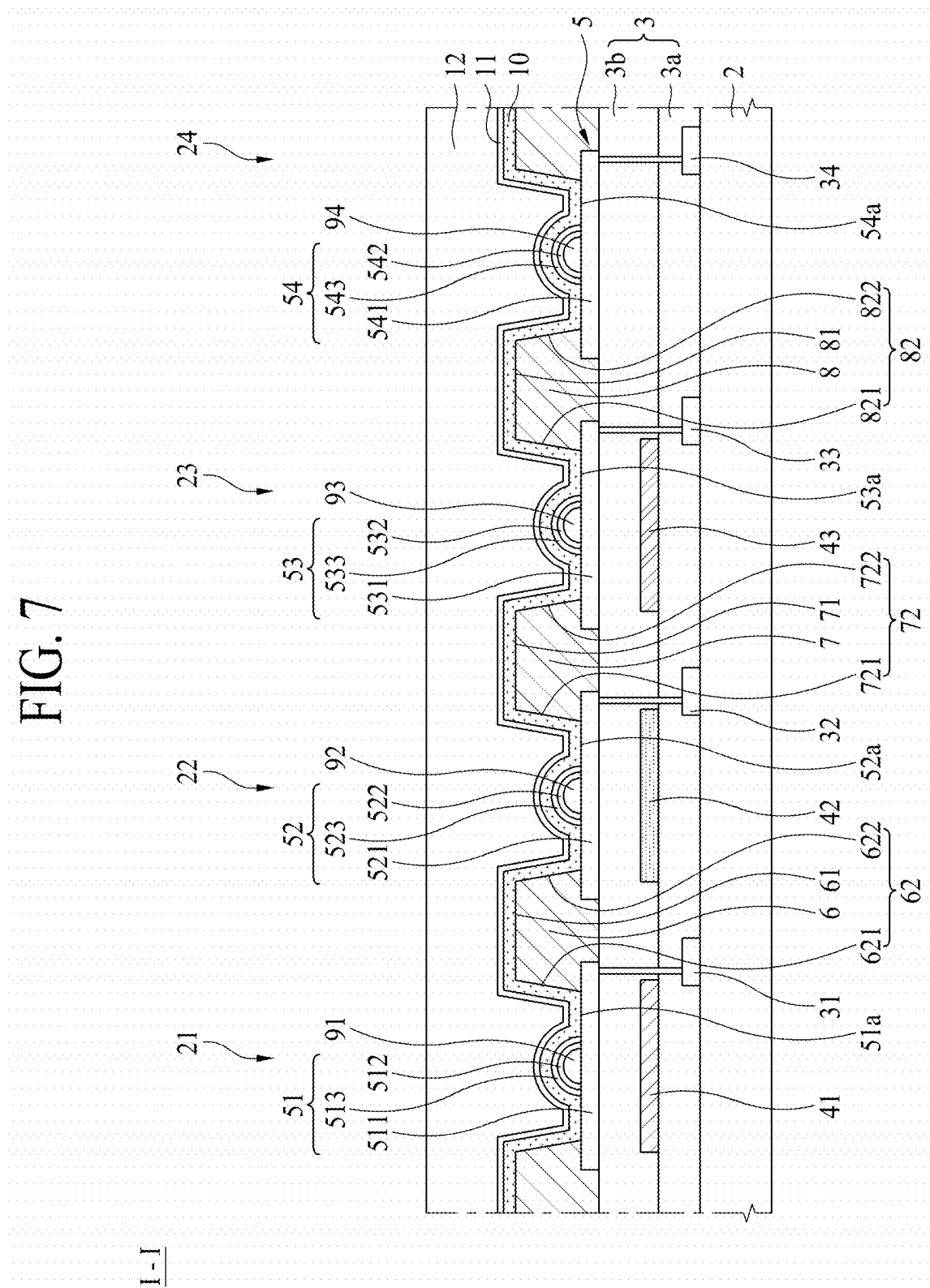
FIG. 7 is a brief plane view illustrating a display device according to another embodiment of the present disclosure.

FIG. 7 is a brief plane view illustrating a display device according to another embodiment of the present disclosure.

Referring to FIG. 7, in the display device 1 according to another embodiment of the present disclosure, the organic light emitting layer 10 may be provided to emit white light and arranged as a common layer over the first to fourth subpixels 21, 22, 23 and 24. In this case, the organic light emitting layer 10 may cover a top surface and an inclined surface of each of the first bank 6, the second bank 7 and the third bank 8. However, even in this case, since an electric field is formed between the first to fourth sub electrodes 51, 52, 53 and 54, which are not covered by the first bank 6, the second bank 7 and the third bank 8, and the second electrode 11, a color mixture between the subpixels due to a leakage current may not occur.

Also, in the display device 1 according to another embodiment of the present disclosure, since the organic light emitting layer 10 emitting white light is arranged as a common layer, a first color filter 41 of a red color R may be provided in the first subpixel 21 provided to emit red light, a second color filter 42 of a green color G may be provided in the second subpixel 22 provided to emit green light, and a third color filter 43 of a blue color B may be provided in the third subpixel 23 provided to emit blue light. However, since the organic light emitting layer 10 is provided to emit white light, a color filter is not arranged in the fourth subpixel 24 provided to emit white light and therefore white light emitted from the organic light emitting layer 10 is emitted from the fourth subpixel 24 as it is.

Figure 8A:
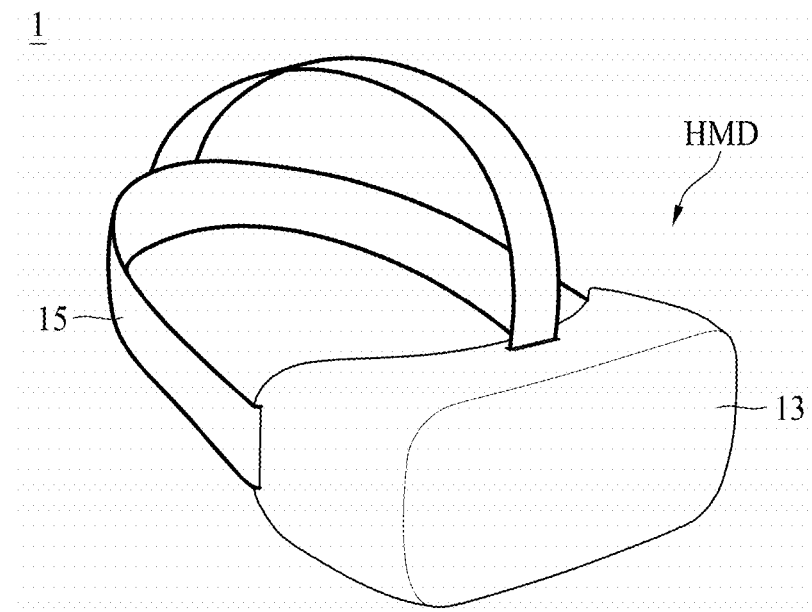
FIGS. 8A to 8C are views illustrating a display device according to another embodiment of the present disclosure, and relate to a head-mounted display (HMD) device.
Figure 8B:
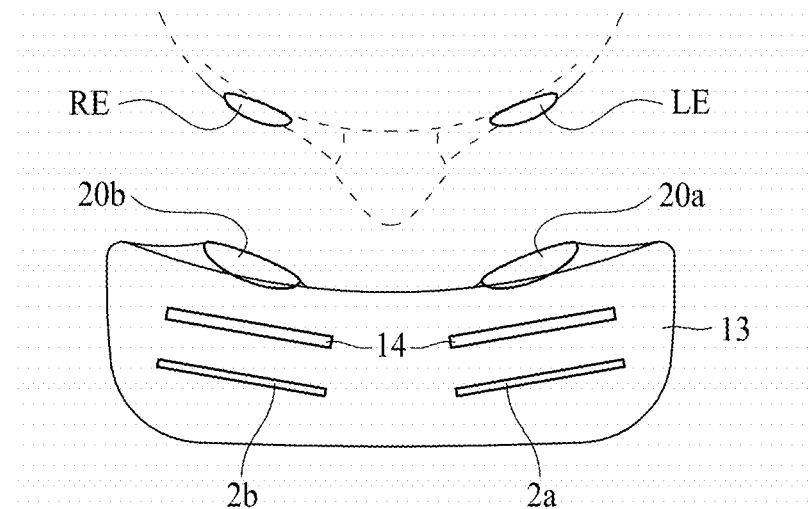
Figure 8C:
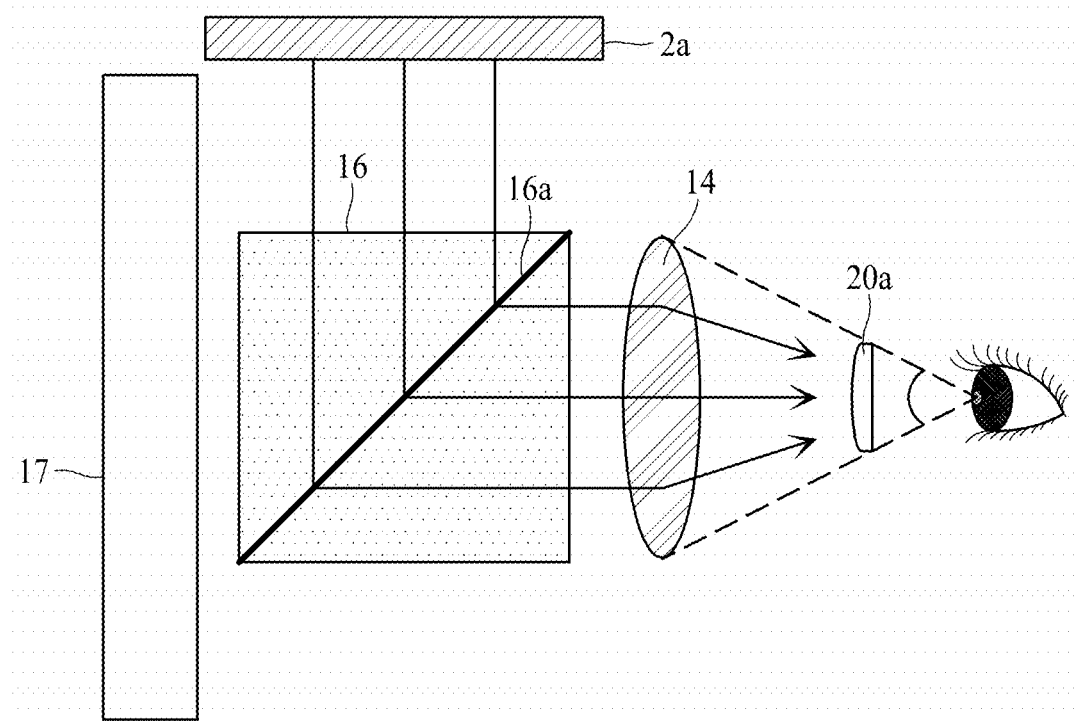

FIGS. 8A to 8C are views illustrating a display device according to other embodiment of the present disclosure, and relate to a head-mounted display (HMD) device. FIG. 8A is brief perspective view, FIG. 8B is a brief plane view of a virtual reality (VR) structure, and FIG. 8C is a brief cross-sectional view of an augmented reality (AR) structure.

As will be aware of it from FIG. 8A, a head mounted display device according to present disclosure comprises a storage case 13 and a head mounted band 15.

The storage case 13 stores elements such as a display device, a lens array, and an ocular lens therein.

The head mounted band 15 is fixed to the storage case 13. The head mounted band 15 is formed to surround a top surface and both sides of a user's head, but is not limited to this example. The head mounted band 15 is to fix a head mounted display to a user's head and may be replaced with a structure of a shape of a glasses frame or a helmet shape.

As will be aware of it from FIG. 8B, the head mounted display device 1 of a virtual reality (VR) structure according to the present disclosure may include a left eye display device 2a, a right eye display device 2b, a lens array 14, a left eye ocular lens 20a, and a right eye ocular lens 20b.

The left eye display device 2a, the right eye display device 2b, the lens array 14, the left eye ocular lens 20a and the right eye ocular lens 20b are stored in the storage case 13 described above.

The left eye display device 2a and the right eye display device 2b may display the same image, and in this case, a user may view a 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 7 described above. For example, each of the left eye display device 2a and the right eye display device 2b may be an organic light emitting display device.

Each of the left eye display device 2a and the right eye display device 2b may include a plurality of subpixels, a circuit element layer 3, a color filter layer 4, a first electrode 5, a first bank 6, a second bank 7, a third bank 8, a light absorption portion 9, an organic light emitting layer 10, a second electrode 11, and an encapsulation layer 12, and may display various images by combining colors of light emitted from each of the subpixels in various manners.

The lens array 14 may be provided between the left eye ocular lens 20a and the left eye display device 2a by being spaced apart from each of the left eye ocular lens 20a and the left eye display device 2a. That is, the lens array 14 may be arranged in front of the left eye ocular lens 20a and behind the left eye display device 2a. Also, the lens array 14 may be provided between the right eye ocular lens 20b and the right eye display device 2b by being spaced apparat from each of the right eye ocular lens 20b and the right eye display device 2b. That is, the lens array 14 may be arranged in front of the right eye ocular lens 20b and behind the right eye display device 2b.

The lens array 14 may be a micro lens array. The lens array 14 may be replaced with a pin hole array. Due to the lens array 14, images displayed on a left eye display device 2a or a right eye display device 2b may be viewed to be magnified to a user.

A left eye LE of a user may be arranged in the left eye ocular lens 20a, and a right eye RE of a user may be arranged in the right eye ocular lens 20b.

As will be aware of it from FIG. 8C, a head mounted display device of an augmented reality (AR) structure according to the present disclosure includes a left eye display device 2a, a lens array 14, a left eye ocular lens 20a, a transmissive reflection portion 16, and a transmissive window 17. Although only a structure for a left eye is shown in FIG. 8C for convenience, a structure for a right eye is the same as the structure for the left eye.

The left eye display device 2a, the lens array 14, the left eye ocular lens 20a, the transmissive reflection portion 16, and the transmissive window 17 are stored in the aforementioned storage case 13.

The left eye display device 2a may be arranged at one side of the transmissive reflection portion 16, for example, at an upper side, without covering the transmissive window 17. Therefore, the left eye display device 2a may provide the transmissive reflection portion 16 with an image without covering an outer background viewed through the transmissive window 17.

The left eye display device 2a may be comprised of an electroluminescence display device according to FIGS. 1 to 7 described above. In this case, the top portion corresponding to the surface where images are displayed in FIGS. 1 to 7, for example, the color filter 4 faces the transmissive reflection portion 16.

The lens array 14 may be provided between the left eye ocular lens 20a and the transmissive reflection portion 16.

A left eye of a user is arranged in the left eye ocular lens 20a.

The transmissive reflection portion 16 is arranged between the lens array 14 and the transmissive window 17. The transmissive reflection portion 16 may include a reflective surface 16a which transmits a portion of light and reflects another portion of light. The reflective surface 16a is formed to allow an image displayed on the left eye display device 2a to proceed to the lens array 14. Therefore, a user may view all of images displayed on the left eye display device 2a and an outer background through the transmissive window 17. That is, since the user may view one image by overlapping background in reality with virtual images, augmented reality (AR) may be embodied.

The transmissive window 17 is arranged in front of the transmissive reflection portion 16.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate provided with a first subpixel and a second subpixel;
   a first electrode provided on the substrate, including a first sub electrode provided on the first subpixel and a second sub electrode provided on the second subpixel;
   an organic light emitting layer arranged on the first electrode;
   a second electrode arranged on the organic light emitting layer;
   a first bank provided between the first sub electrode and the second sub electrode to partition the first subpixel and the second subpixel from each other; and
   a light absorption portion arranged inside each of the first sub electrode and the second sub electrode to absorb external light,
   wherein the first sub electrode includes a reflective metal provided to cover the light absorption portion, and
   the reflective metal and the second electrode emit light emitted from the organic light emitting layer to the substrate by reflecting the light emitted from the organic light emitting layer.

2. The display device of claim 1, wherein the first sub electrode is arranged in parallel with the second electrode.

3. The display device of claim 1, wherein the light absorption portion has a width smaller than that of the first sub electrode which is not overlapped with the first bank.

4. The display device of claim 1, further comprising a circuit element layer provided on the substrate, including a first transistor provided on the first subpixel,
   wherein the first sub electrode includes a planarization electrode arranged on the circuit element layer to be in contact with a lower surface of the light absorption portion, and
   the planarization electrode is connected to the first transistor.

5. The display device of claim 4, wherein the first sub electrode includes an auxiliary electrode provided to cover the reflective metal, and an end of the auxiliary electrode is in contact with the planarization electrode.

6. The display device of claim 4, wherein the first transistor is arranged to correspond to the first bank.

7. The display device of claim 1, wherein the reflective metal and the second electrode are opaque, and the first sub electrode except the reflective metal and the substrate are transparent.

8. The display device of claim 1, further comprising a circuit element layer provided on the substrate, including a first transistor provided on the first subpixel,
   wherein the circuit element layer includes an insulating layer covering the first transistor and a planarization layer covering the insulating layer, and
   the planarization layer is provided with a first color filter arranged to correspond to the first subpixel.

9. The display device of claim 8, wherein the first color filter is arranged to partially overlap the first bank.

10. The display device of claim 1, wherein the light absorption portion includes first and second light absorption portions arranged in the first sub electrode, and the first and second light absorption portions are spaced apart from each other.

11. The display device of claim 1, wherein an area ratio of the light absorption portion occupied in an area of the first sub electrode which is not overlapped with the first bank is 25% or more and 80% or less.

12. The display device of claim 1, wherein the reflective metal and the second electrode are arranged to have a first interval that is 50 nm or more and 2000 nm or less.

13. The display device of claim 1, further comprising an encapsulation layer provided to cover the second electrode, wherein light emitted from the organic light emitting layer does not enter the encapsulation layer.

14. The display device of claim 1, wherein the light absorption portion is provided with N light absorption portions (N is an integer greater than 0) or more arranged in the first sub electrode.

15. The display device of claim 1, wherein the substrate includes a third subpixel adjacent to one side of the second subpixel and a fourth subpixel adjacent to one side of the third subpixel,
   the first electrode includes a third sub electrode provided in the third subpixel and a fourth sub electrode provided in the fourth subpixel,
   the organic light emitting layer includes a first organic light emitting layer arranged to correspond to the first subpixel, a second organic light emitting layer arranged to correspond to the second subpixel, a third organic light emitting layer arranged to correspond to the third subpixel, and a fourth organic light emitting layer arranged to correspond to the fourth subpixel, and the first organic light emitting layer is provided to emit red light, the second organic light emitting layer is provided to emit green light, the third organic light emitting layer is provided to emit blue light, and the fourth organic light emitting layer is provided to emit white light.

16. The display device of claim 15, further comprising a circuit element layer provided on the substrate, including a first transistor provided on the first subpixel,
   wherein a first color filter arranged to correspond to the first subpixel, a second color filter arranged to correspond to the second subpixel and a third color filter arranged to correspond to the third subpixel are formed in the circuit element layer, and
   a color filter is not provided in a position of the circuit element layer corresponding to the fourth subpixel.

17. The display device of claim 1, further comprising a lens array spaced apart from the substrate, and a storage case storing the substrate and the lens array.

18. The display device of claim 16, further comprising a lens array spaced apart from the substrate, and a storage case storing the substrate and the lens array.

19. The display device of claim 10, wherein an interval between the first light absorption portion and the second light absorption portion is equal to or greater than a width of each of the first light absorption portion and the second light absorption portion.

20. A display device comprising:
   a substrate provided with a first subpixel, a second subpixel, a third subpixel and a fourth subpixel, the first subpixel provided to emit red light, the second subpixel provided to emit green light, the third subpixel provided to emit blue light, and the fourth subpixel provided to emit white light;
   a first electrode provided on the substrate, including a first sub electrode provided on the first subpixel, a second sub electrode provided on the second subpixel, a third sub electrode provided on the third subpixel and a fourth sub electrode provided on the fourth subpixel;
   an organic light emitting layer arranged on the first electrode;
   a second electrode arranged on the organic light emitting layer; and
   a light absorption portion arranged at least inside each of the second sub electrode and the fourth sub electrode on the second and fourth subpixels provided to emit green and white lights to absorb external light,
   wherein the second sub electrode includes a reflective metal provided to cover the light absorption portion, and
   the reflective metal and the second electrode emit light emitted from the organic light emitting layer to the substrate by reflecting the light emitted from the organic light emitting layer.

* * * * *